United States Patent
Fukuda et al.

(10) Patent No.: US 7,270,893 B2
(45) Date of Patent: *Sep. 18, 2007

(54) ORGANIC ELECTROLUMINESCENT ELEMENT AND DISPLAY

(75) Inventors: Mitsuhiro Fukuda, Chofu (JP); Hiroshi Kita, Hachioji (JP); Taketoshi Yamada, Saitama (JP)

(73) Assignee: Konica Minolta Holdings, Inc. (JP)

( * ) Notice: Subject to any disclaimer, the term of this patent is extended or adjusted under 35 U.S.C. 154(b) by 75 days.

This patent is subject to a terminal disclaimer.

(21) Appl. No.: 10/718,360

(22) Filed: Nov. 20, 2003

(65) Prior Publication Data

US 2004/0110031 A1 Jun. 10, 2004

(30) Foreign Application Priority Data

Nov. 26, 2002 (JP) .............................. 2002-342192

(51) Int. Cl.
*H01J 1/62* (2006.01)

(52) U.S. Cl. .................... 428/690; 428/917; 313/504; 313/506; 257/102; 257/103

(58) Field of Classification Search ................ 428/690, 428/917; 313/504, 506; 546/26, 183; 252/301.16; 549/23, 28, 400, 404, 406; 257/102, 103
See application file for complete search history.

(56) References Cited

U.S. PATENT DOCUMENTS

| | | | | |
|---|---|---|---|---|
| 2003/0186077 | A1* | 10/2003 | Chen | 428/690 |
| 2003/0205696 | A1* | 11/2003 | Thoms et al. | 252/301.16 |
| 2004/0086745 | A1* | 5/2004 | Iwakuma et al. | 428/690 |
| 2004/0115476 | A1* | 6/2004 | Oshiyama et al. | 428/690 |

FOREIGN PATENT DOCUMENTS

JP 2002-308837 * 10/2002

* cited by examiner

*Primary Examiner*—Rena Dye
*Assistant Examiner*—Camie S. Thompson
(74) *Attorney, Agent, or Firm*—Cantor Colburn LLP

(57) ABSTRACT

An object of the invention is to provide an organic electroluminescent element with high luminance and long half life and a display employing the organic EL element.

An organic electroluminescent element comprising a component layer including at least one light emission layer capable of emitting phosphorescence, wherein the component layer contains at least one specific carbazole derivative.

11 Claims, 3 Drawing Sheets

ORGANIC ELECTROLUMINESCENT ELEMENT AND DISPLAY

FIELD OF THE INVENTION

This invention relates to an organic electroluminescent element (organic EL element) and a display, and particularly to an organic electroluminescent element with high emission luminance, excellent emission efficiency, and high durability and a display employing the organic electroluminescent element.

BACKGROUND OF THE INVENTION

As an emission type electronic displaying device, there is an electroluminescence device (ELD). As elements constituting the ELD, there is an inorganic electroluminescence element or an organic electroluminescent element (hereinafter referred to also as organic EL element). The inorganic electroluminescent element has been used for a plane-shaped light source, but a high voltage alternating current has been required to drive the element.

An organic electro-luminescent element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by inactivation of the exciton, and the element can emit light by applying a relatively low voltage of from several volts to several decade volts. The element has a wide viewing angle and a high visuality since the element is of-self light emission type. Further, the element is a thin, complete solid element, and therefore, the element is noted from the viewpoint of space saving and portability.

An organic EL element for practical use is required which efficiently emits light with high luminance at a lower power. For example, there are disclosed an element with long lifetime emitting light with high luminance in which stilbene derivatives, distyrylarylene derivatives or tristyrylarylene derivatives are doped with a slight amount of a fluorescent compound (see, for example, Japanese Patent No. 3093796), an element which comprises an organic light emission layer containing an 8-hydroxyquinoline aluminum complex as a host compound doped with a slight amount of a fluorescent compound (see, for example, Japanese Patent O.P.I. Publication No. 63-264692), and an element which comprises an organic light emission layer containing an 8-hydroxyquinoline aluminum complex as a host compound doped with a quinacridone type dye (see, for example Japanese Patent O.P.I. Publication No. 3-255190).

When light emitted through excited singlet state is used in the element disclosed in the above patent documents, the upper limit of the external quantum efficiency ($\eta$next) is considered to be at most 5%, as the generation ratio of singlet excited species to triplet excited species is 1:3, that is, the generation probability of excited species capable of emitting light is 25%, and further, external light emission efficiency is 20%.

Since an organic EL element, employing phosphorescence through the excited triplet, was reported by Prinston University (for example, see M. A. Baldo et al., Nature, 395, p. 151-154 (1998), study on materials emitting phosphorescence at room temperature has been actively made (for example, see M. A. Baldo et al., Nature, 403, 17, p. 750-753 (2000) or U.S. Pat. No. 6,097,147).

As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

For example, many kinds of heavy metal complexes such as iridium complexes has been synthesized and studied (for example, see S. Lamansky et al., J. Am. Chem. Soc., 123, 4304 (2001)).

An example employing tris(2-phenylpyridine)iridium as a dopant has been studied (for example, see M. A. Baldo et al., Nature, 403, 17, p. 750-753 (2000)).

Further, an example employing as a dopant $L_2Ir$ (acac) (in which L represents a ligand) such as $(ppy)_2Ir$ (acac) (for example, see M. E. Thompson et al., The 10th International Workshop on Inorganic and Organic Electroluminescence (EL' 00, Hamamatsu)), or employing as a dopant tris(2-p-tolylpyridine)iridium {$Ir(ptpy)_3$}, tris(benzo-[h]-quinoline) iridium {$Ir(bzq)_3$}, or $Ir(bzq)_2ClP$ $(Bu)_3$ has been studied (for example, see Moon-Jae Youn. Og, Tetsuo Tsutsui et al., The 10th International Workshop on Inorganic and Organic Electroluminescence (EL' 00, Hamamatsu)).

A hole transporting material is used as a host of a phosphorescent compound in order to increase emission efficiency (see, for example, Ikai et al., The 10th International Workshop on Inorganic and Organic Electroluminescence (EL' 00, Hamamatsu)).

Various kinds of electron transporting materials are used as a host of a phosphorescent compound, and further doped with a new iridium complex (for example, see non-patent document 4 below). High emission efficiency is obtained by incorporation of a hole blocking layer (for example, see Moon-Jae Youn. Og, Tetsuo Tsutsui et al., The 10th International Workshop on Inorganic and Organic Electroluminescence (EL' 00, Hamamatsu)).

An external qauntum efficiency of around 20%, which is theoretically a threshold value, is attained in green light emission, but a sufficient emission efficiency is not attained in another color light, where there is room to be improved. An organic EL element for practical use is required which efficiently emits light with high luminance at a lower power.

In order to solve the problems described above, many kinds of compounds as described above have been proposed, and carbazole derivatives have been studied among them. For example, N-phenylcarbazole derivatives as an electron transporting material are disclosed in Japanese Patent O.P.I. Publication No. 8-60144, and biscarbazole derivatives as a hole injecting material in which two carbazole rings are connected through a vinylene group are disclosed in Japanese Patent O.P.I. Publication No. 5-194943. A phosphorescence emitting element employing a polymer having a carbazole nucleus is proposed in Japanese Patent O.P.I. Publication No. 2001-257076, and a compound in which an aryl group bonds to carbazole at its N position is proposed in Japanese Patent O.P.I. Publication No. 2002-100476. However, an organic electroluminescent element employing these compounds disclosed in these documents does not solve all of quantum efficiency, emission luminance, and durability, problems to be solved for practical use.

SUMMARY OF THE INVENTION

An object of the invention is to provide an organic electroluminescent element (hereinafter also referred to as an organic EL element) with high emission luminance, high quantum efficiency and long half life and a display employing the organic EL element, and is particularly to provide an organic EL element emitting a blue light with high emission luminance, high quantum efficiency and long half life and a display employing the organic EL element.

DETAILED DESCRIPTION OF THE INVENTION

Figure 1:
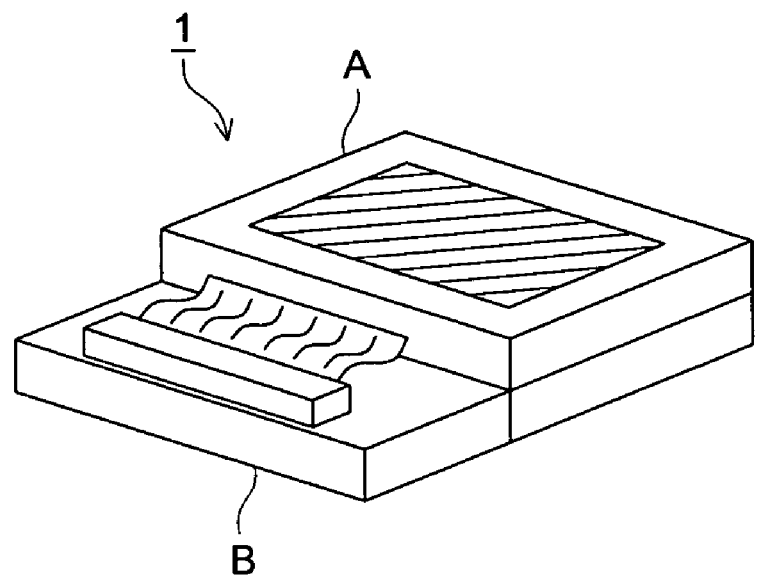
FIG. 1 is a schematic drawing of one example of a display comprising an organic EL element.

The above object of the invention can be attained by the following constitution:

1. An organic electroluminescent element comprising a component layer including a light emission layer, wherein the light emission layer contains a phosphorescent compound, and the component layer contains a compound represented by the following formula 1,

  Formula 1 wherein A represents a substituted or unsubstituted aromatic ring residue; n is a natural number of from 3 to 6; and Z represents a monovalent organic group represented by the following formula 2, provided that formula 1 does not have an n-fold axis of symmetry,

  Formula 2 wherein L represents a chemical bond or a divalent linkage group; and Cz represents a substituted or unsubstituted carbazole residue.

2. The organic electroluminescent element of item 1 above, wherein the light emission layer contains the compound of formula 1

3. The organic electroluminescent element of item 1 above, wherein n in formula 1 is 3, provided that the formula 1 does not have a 3-fold axis of symmetry.

4. The organic electroluminescent element of item 1 above, wherein the aromatic ring of the aromatic ring residue represented by A of formula 1 is an aromatic ring selected from the group consisting of a benzene ring, a pyridine ring, a pyridazine ring, a pyrimidine ring, a pyrazine ring, a 1,3,5-triazine ring, a 1,2,4-triazine ring, a pyrrole ring, an imidazole ring, a furan ring, a thiophene ring, and a condensed aromatic ring which two or more thereof are condensed to form.

5. The organic electroluminescent element of item 1 above, wherein in formula 1, at least one Z has a chemical structure different from that of another Z.

6. The organic electroluminescent element of item 4 above, wherein the aromatic ring of the aromatic ring residue is a benzene ring, a pyridine ring, or an 1,3,5-triazine ring.

7. The organic electroluminescent element of item 1 above, wherein in formula 2, L is a chemical bond or a group selected from the group consisting of arylene, heteroarylene, alkenylene, and —Si(R)$_2$— in which R represents an alkyl group a cycloalkyl group, an alkenyl group, an alkinyl group, an aryl group, a heteroaryl group, a saturated heterocyclic group or a halogenated hydrocarbon group.

8. The organic electroluminescent element of item 7 above, wherein L is a chemical bond.

9. The organic electroluminescent element of item 1 above, wherein the phosphorescent compound is a complex containing a metal belonging to a group VIII of the periodic table as a center metal or a complex containing a rare earth element as a center element.

10. The organic electroluminescent element of item 9 above, wherein the phosphorescent compound is an iridium complex, an osmium complex, or a platinum complex.

11. The organic electroluminescent element of item 10 above, wherein the phosphorescent compound is an iridium complex.

12. A display comprising the organic electroluminescent element of any one of items 1 through 11 above.

1-1. An organic electroluminescent element comprising a component layer including at least one light emission layer capable of emitting phosphorescence, wherein the component layer contains a compound represented by formula 1 above.

1-2. The organic electroluminescent element of item 1-1 above, wherein the light emission layer contains the compound of formula 1

1-3. The organic electroluminescent element of item 1-1 or 1-2 above, wherein n in formula 1 is 3, provided that the formula 1 does not have a 3-fold axis of symmetry.

1-4. The organic electroluminescent element of any one of items 1-1 through 1-3 above, wherein the aromatic ring of the aromatic ring residue represented by A of formula 1 is an aromatic ring selected from the group consisting of benzene, naphthalene, anthracene, pyrene, pyridine, pyridazine, pyrimidine, pyrazine, 1,2,4-triazine, pyrrole, furan, thiophene and a condensed ring which two or more thereof are condensed to form.

1-5. The organic electroluminescent element of any one of items 1-1 through 1-4, wherein in formula 1, at least one Z has a chemical structure different from that of another Z.

1-6. The organic electroluminescent element of any one of items 1-1 through 1-5 above, wherein in formula 1, the aromatic ring of the aromatic ring residue is a benzene, pyridine, or 1,3,5-triazine ring.

1-7. The organic electroluminescent element of any one of items 1-1 through 1-6 above, wherein in formula 2, L is a chemical bond or a group selected from the group consisting of arylene, heteroarylene, vinylene and —Si(R)$_2$— in which R represents a monovalent organic substituent.

1-8. The organic electroluminescent element of item 1-7 above, wherein L is a chemical bond.

1-9. A display comprising the organic electroluminescent element of any one of items 1-1 through 1-8 above The organic electroluminescent element of the invention comprises a component layer including a light emission layer, wherein the light emission layer contains a phosphorescent compound (hereinafter also referred to as the phosphorescent compound in the invention) capable of emitting phosphorescence, and the component layer contains a compound (hereinafter also referred to as the compound in the invention) represented by formula 1 above.

The compound in the invention will be explained in detail below.

In formula 1 above, A represents an aromatic ring residue. Examples of the aromatic ring, which is a nucleus of the aromatic ring residue, include a benzene ring, a pyridine ring, a pyridazine ring, a pyrimidine ring, a pyrazine ring, a 1,3,5-triazine ring, a 1,2,4-triazine ring, a pyrrole ring, an imidazole ring, a furan ring, a thiophene ring, and a condensed aromatic ring which two or more thereof are condensed to form, for example, a naphthalene ring, an anthracene ring, a pyrene ring, a dithienobenzene ring, a carbazole ring, or quinoline ring. Further, the condensed aromatic ring may be a fluorene ring, an azulene ring or a phenothiazine ring, each being other than the condensed aromatic ring described above.

Examples of the substituent include an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, or a pentadecyl group), a cycloalkyl group (for example, a cyclopentyl group or a cyclohexyl group), an alkenyl group (for example, a vinyl group or a allyl group), an alkinyl group (for example, a propargyl group), an aryl group (for example, a phenyl group, or a naphthyl group), a heterocyclic group (for example, a pyridyl group, a thiazolyl group, an oxazolyl group, an imidazolyl group, a furyl group, a pyrrolyl group, a pyrazinyl group, a pyrimidinyl group, a pyridazinyl group, a selenazolinyl group, a sulfolanyl group, a piperidinyl group, a pyrazolyl group, or a tetrazolyl group), a halogen atom (for example, a chlorine atom, a bromine atom, an iodine atom, or a fluorine atom), an alkoxy group (for example, a methoxy group, an ethoxy group, a propoxy group, a pentyloxy group, a hexyloxy group, an octyloxy group, or a dodecyloxy group), a cycloalkoxy group (for example, a cyclopentyloxy group, or a cyclohexyloxy group), an aryloxy group (for example, a phenoxy group or a naphthyloxy group), an alkylthio group (for example, a methylthio group, an ethylthio group, a propylthio group, a pentylthio group, a hexylthio group, an octylthio group, or a dodecylthio group), a cycloalkylthio group (for example, a cyclopentylthio group or a cyclohexylthio group), an arylthio group (for example, a phenylthio group, or a naphthylthio group), an alkoxycarbonyl group (for example, a methyloxycarbonyl group, an ethyloxycarbonyl group, a butyloxycarbonyl group, an octyloxycarbonyl group, or a dodecyloxycarbonyl group), an aryloxycarbonyl group (for example, a phenyloxycarbonyl group, or a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, or a 2-pyridylaminosulfonyl group), a ureido group (for example, a methylureido group, an ethylureido group, a pentylureido group, a cyclohexylureido group, an octylureido group, a dodecylureido group, a phenylureido group, a naphthylureido group, or a 2-pyridylureido group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecycarbonyl group, a phenylcarbonyl group, a naphthylcarbonyl group, or a pyridylcarbonyl group), an acyloxy group (for example, an acetyloxy group, an ethylcarbonyloxy group, a butylcarbonyloxy group, an octylcarbonyloxy group, a dodecycarbonyloxy group, or a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, 2-ethylhexylcarbonylamino group, an octylcarbonylamino group, a dodecycarbonylamino group, a phenylcarbonylamino group, or a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, or a 2-pyridylaminocarbonyl group), a sulfinyl group (for example, a methylsulfinyl group, an ethylsulfinyl group, a butylsulfinyl group, a cyclohexylsulfinyl group, a 2-ethylhexylsulfinyl group, a dodecysulfinyl group, a phenylsulfinyl group, a naphthylsulfinyl group, or a 2-pyridylsulfinyl group), an alkylsulfonyl or arylsulfonyl group (for example, a methylsulfonyl group, an ethylsulfonyl group, a butylsulfonyl group, a cyclohexylsulfonyl group, a 2-ethylhexylsulfonyl group, a dodecysulfonyl group, a phenylsulfonyl group, a naphthylsulfonyl group, or a 2-pyridylsulfonyl group), an amino group (for example, an amino group, an ethylamino group, a dimethylamino group, a butylamino group, a cyclopentylamino group, a 2-ethylhexylamino group, a dodecyamino group, an anilino group, a naphthylamino group, or a 2-pyridylamino group), a nitro group, a cyano group, a hydroxyl group, and a halogen atom. The groups described above may have further the same substituent as denoted above or may be combined with each other to form a ring.

In formula 1 above, Z is represented by formula 2, in which n is an integer of from 3 to 6, and preferably 3.

In formula 2 above, L represents a chemical bond or a divalent linkage group. Herein, the chemical bond refers to a linkage directly connecting groups to be connected. Examples of the divalent linkage group include a divalent hydrocarbon group such as alkylene, alkenylene, alkenylene, or arylene, a heteroatom-containing divalent group and a heteroatom itself. Examples of the heteroatom-containing divalent group include a divalent aromatic heterocyclic group (hereinafter also referred to as heteroarylene) such as thiophene-2,5-diyl, or pyrazine-2,3-diyl. Examples of the heteroatom include a chalcogen atom such as oxygen or sulfur. The divalent linkage group may be a divalent group connecting A in formula 1 with Cz in formula 2 through a divalent group containing a heteroatom, for example, alkylimino, dialkylsilanediyl, or diarylgermanediyl. These divalent linkage groups may have a substituent, and examples of the substituent are the same as those denoted above in A of formula 1. The divalent linkage group as L of formula 2 is preferably arylene, heteroarylene, alkenylene, —Si(R)$_2$—, or a combination thereof. R of the —Si(R)$_2$— represents a monovalent organic substituent such as an alkyl group (for example, a methyl group, an ethyl group, a propyl group, an isopropyl group, a t-butyl group, a pentyl group, a hexyl group, an octyl group, a dodecyl group, a tridecyl group, a tetradecyl group, or a pentadecyl group), a cycloalkyl group (for example, a cyclopentyl group or a cyclohexyl group), an alkenyl group (for example, a vinyl group or an allyl group), an alkinyl group (for example, an ethynyl group or a propargyl group), an aryl group (for example, a phenyl group, or a naphthyl group), a heteroaryl group (for example, a furyl group, a thienyl group, a pyridyl group, a pyridazyl group, a pyrimidyl group, a pyrazinyl group, a triazinyl group, an imidazolyl group, a pyrazolyl group, a thiazolyl group, a benzoimidazolyl group, a benzoxazolyl group, a quinazolyl group or a phthalazinyl group, a saturated heterocyclic group (for example, a pyrrolidyl group, an imidazolinyl group, a morpholinyl group, or an oxazolidinyl group) or a halogenated hydrocarbon group (for example, a fluoromethyl group, a trifluoromethyl group, a pentafluoroethyl group, or a pentafluorophenyl group). The monovalent substituent above may further have the same substituent above.

Cz in formula 2 represents a substituted or unsubstituted carbazole residue. Examples of the substituent include the same as those denoted in A of formula 1. The substituent is preferably an alkyl group, an alkoxy group, a fluoroalkyl group, an alkylthio group, an aryl group, a heterocyclic group, a halogen atom or a cyano group, and more preferably an alkyl group, a fluoroalkyl group, an aryl group, a heterocyclic group, a fluorine atom or a cyano group. The bonding position at which the carbazole residue bonds to L is not specifically limited, but it is preferred that the carbazole residue bond to L at a 2-, 3- or 9-position (at an N position) of the carbazole residue.

In the compound in the invention, the three to six carbazole residues bond directly or through a linkage group to the aromatic ring residue. The compound in the invention is characterized in that when the compound has n carbazole residues bonding to the aromatic ring residue, the molecular structure of the compound does not have an n-fold axis of symmetry. For example, a compound represented by structural formula 1 as shown below has three carbazole residues bonding to the benzene ring as the aromatic ring residue, and has a three-fold axis of symmetry in the molecular structure, which is perpendicular to the plane formed by the benzene nucleus. This compound has a structural formula in which a molecule having n carbazole residues has an n-fold axis of symmetry, and is a compound falling outside the claimed scope. In contrast, a compound represented by structural formula 2 as shown below has three carbazole residues bonding to the aromatic ring residue, a pyridazine ring residue, and has a two-fold axis of symmetry in the molecular structure, which is a line connecting the carbon atom at the 2-position of the pyridazine ring residue with the carbon atom at the 4-position of the pyridazine ring residue, but does not have a three-fold axis of symmetry. Therefore, this compound has a compound falling within the claimed scope. The molecule of structural formula 3 as shown below having three carbazole residues bonding to the pyrazine ring residue, does not have a two-fold axis of symmetry in the molecular structure, which the molecule of structural formula 2 has, nor any symmetric property. This molecule is also a compound falling within the scope of the invention. In the above, explanation is made on relatively low molecular weight molecules, but with respect to the symmetry, the same as described above applies to a molecule having two or more of the structure represented by formula 1 in the molecule, e.g., a molecule in which carbazole derivative residues bonding to the aromatic ring residue further have a substituent represented by formula 2. When a compound represented by formula 1 has n carbazole derivative residues bonding to the aromatic ring residue represented by A and has an n-fold axis of symmetry, where both n are the same number, the compound is a compound falling outside the scope of the invention. As one example of such a compound, a compound represented by structural formula 4 is shown below, which has a 3-fold axis of symmetry. A compound represented by structural formula 5 shown below is one example of a compound falling within the scope of the invention, which has in the molecule two or more of the aromatic ring residue represented by A in formula 1.

Structural formula 1 (a compound disclosed in Japanese Patent O.P.I. Publication No. 2002-100476)

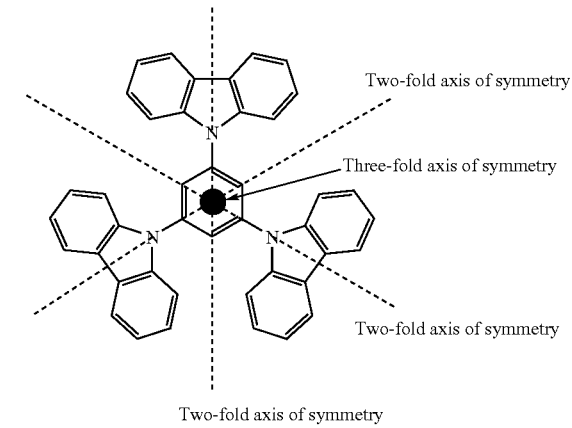

Structural formula 2 (a compound in the invention)

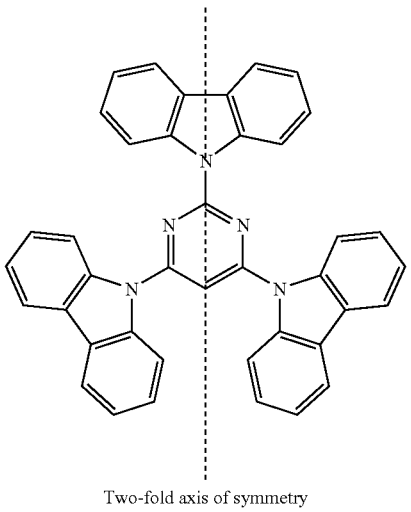

Structural formula 3 (a compound in the invention)
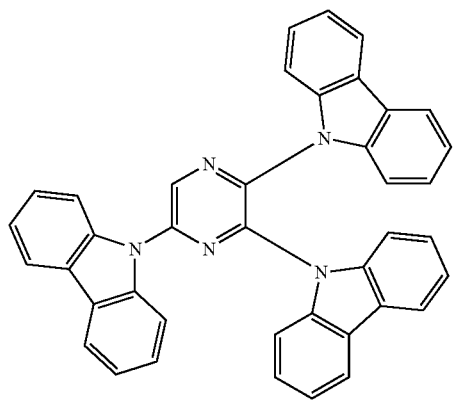
No axis of symmetry
Structural formula 4 (a compound having three of a carbazole residue represented by formula 2, and a three-fold axis of symmetry)
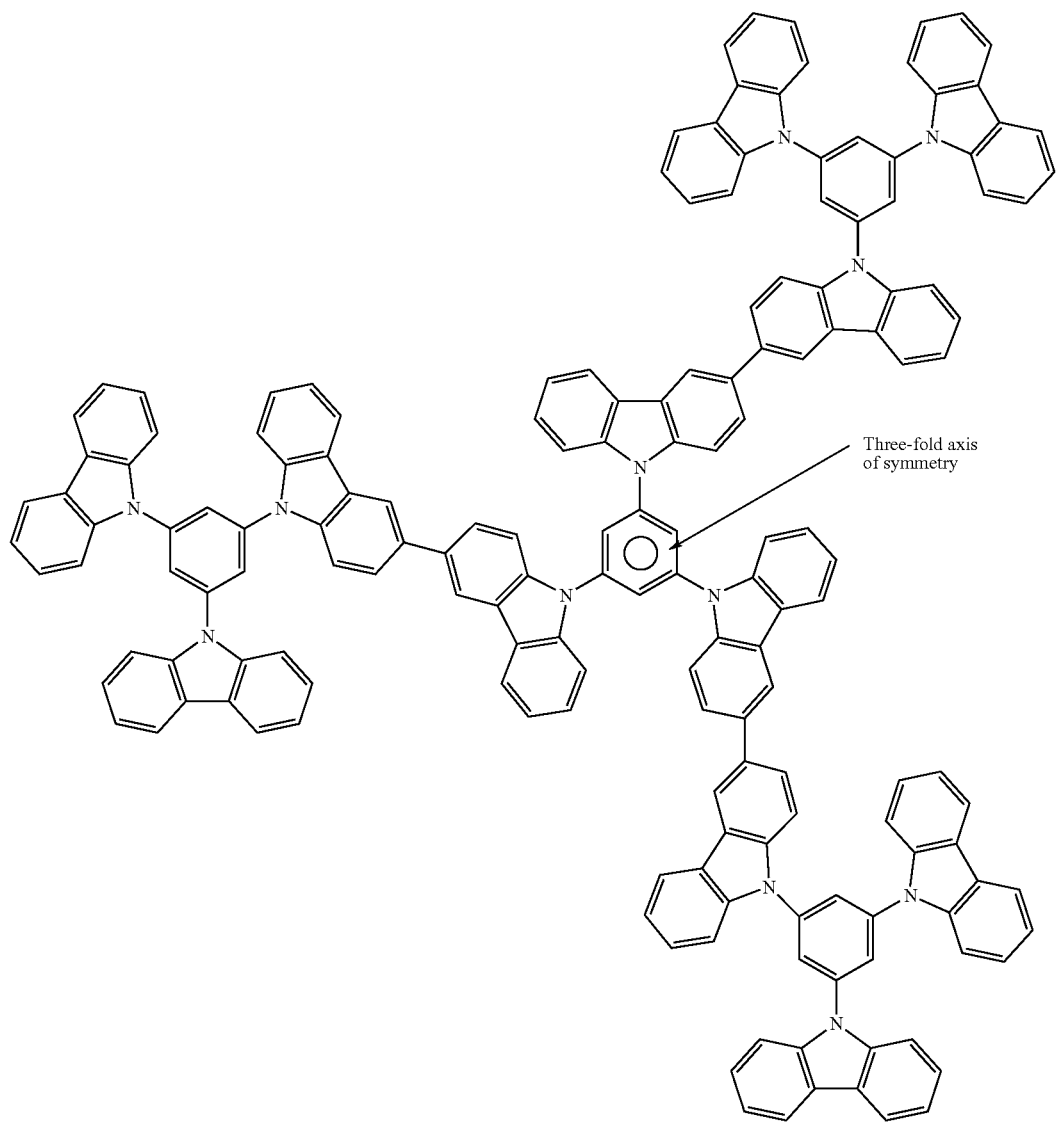

Structural formula 5 (a non-symmetric compound having two or more of a carbazole residue represented by formula 2 but not having any axis of symmetry, which falls within the scope of the invention)

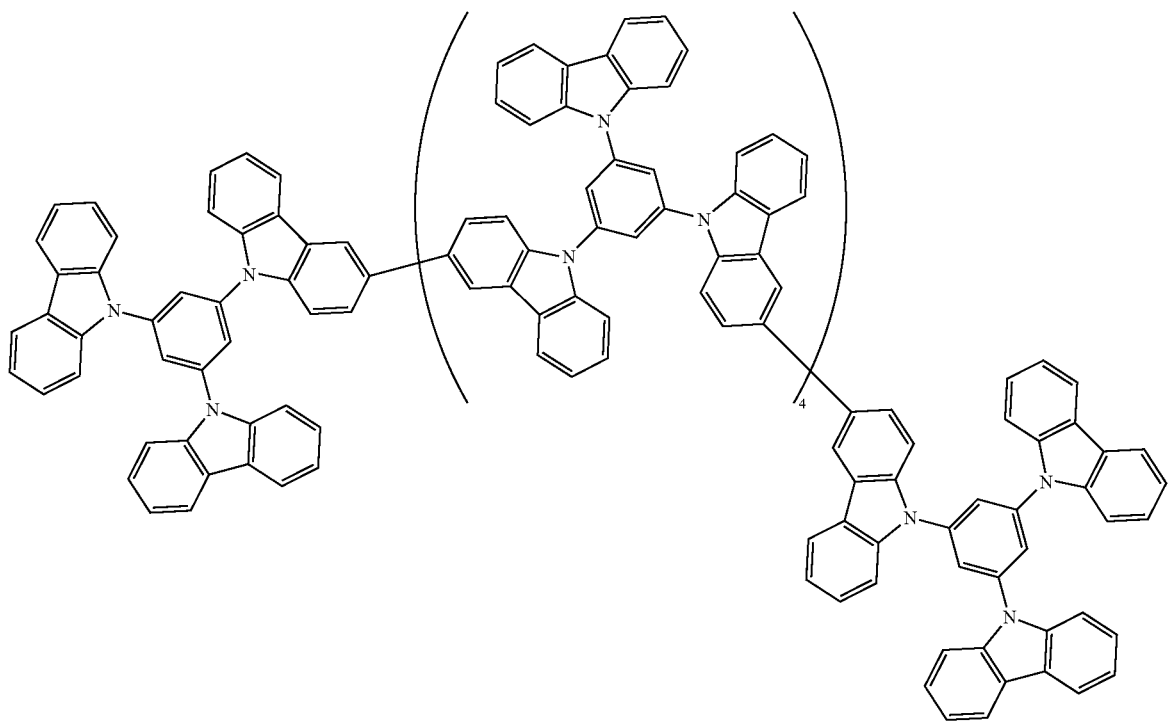

In the invention, a compound, in which n Zs in formula 1 are different from another, is preferably used. The compounds having structural formulas 1, 2 and 3 are compounds in which in formula 1, the aromatic ring residue A is different from another, and the n Zs are the same, carbazolyl groups. In contrast, the compound of structural formula 6 as shown later is a compound in which in formula 1, one of n Zs is different from another, and therefore, a compound falling within the scope of the invention, which does not have an n-fold axis of symmetry. Examples of a compound in formula 1, in which at least one of n Zs is different from another, include a compound-in which in formula 1, one of n Zs is different from another as shown in structural formula 6, a compound in which in formula 2, one of n Ls of n —L—Cz is different from another as shown in structural formula 7, and a compound in which in formula 2, one of n Ls of n —L—Czs is different from another and one of n Czs of n —L—Czs is different from another as shown in structural formula 8.

Structural formula 6 (a compound in the invention)

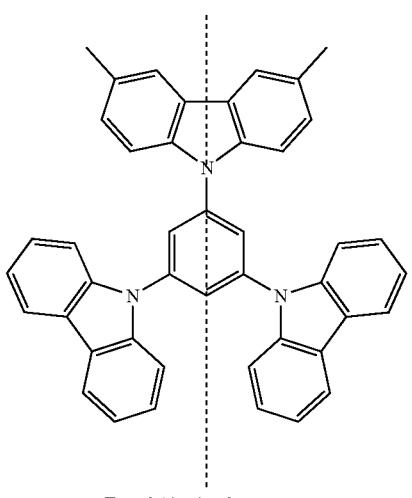

Two-fold axis of symmetry

Structural formula 7 (a compound in the invention)

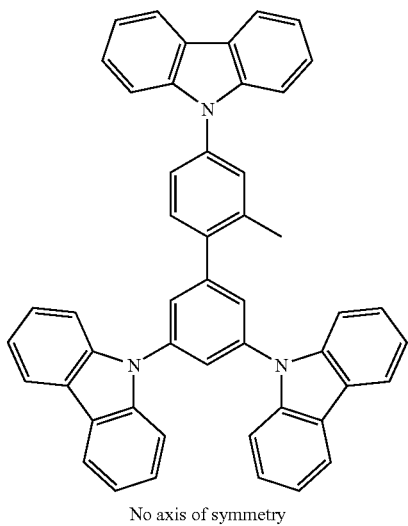

No axis of symmetry

Structural formula 8 (the compound in the invention)

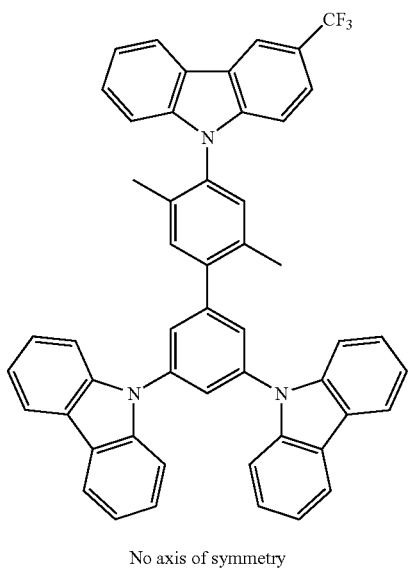

No axis of symmetry

The compound in the invention can be used in any of a hole transporting layer, an electron transporting layer, or a light emission layer of the organic EL element to be described later, and is used preferably in the hole transporting layer or the light emission layer. It is especially preferred that the compound is used in the light emission layer as a material as a host compound known in the art, which does not emit light but transfers energy to a phosphorescent compound, since it can provide an organic EL element with excellent quantum yield, excellent emission luminance, and high durability. The reason or mechanism is not clear that the compound in the invention can provide excellent characteristics as compared with conventional materials known in the art. In the compound in the invention, the characteristic in the molecular structure defined in the invention may prevent undesired phenomenon from occurring in which when the compound is used in the layer of the organic EL element, crystallization thereof occurs in the layer during continuous operation or storage of the element. The compound having structural formula 1, which has three carbazole derivative residues and a three-fold axis of symmetry, is likely to vary from non-crystalline state to crystalline state due to its symmetrical structure during continuous operation or storage. In contrast, the compound having structural formula 2, which does not have a highly symmetric structure as in propeller shape, is difficult to be in a crystalline state, and the compound is kept non-crystalline for a long time in the layer in which it is contained, which can provide an organic EL element with high durability.

Exemplified compounds of the compound in the invention will be listed below, but are not limited thereto, as long as they fall within the scope of the invention.

| | | | Z | |
| No. | A | —L— | —Cz | n |
| --- | --- | --- | --- | --- |
| 1 | pyrimidine | —* | carbazole | 3 |

-continued
| | | | | |
|---|---|---|---|---|
| 2 | 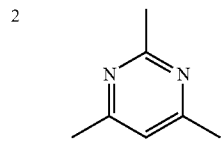 | 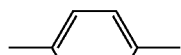 | 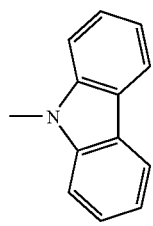 | 3 |
| 3 | 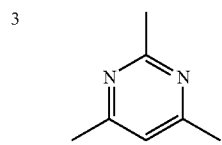 | 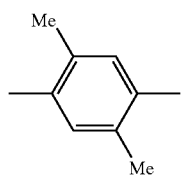 | 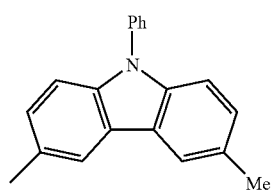 | 3 |
| 4 | 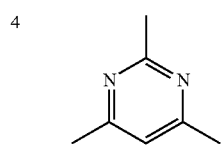 | 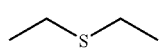 | 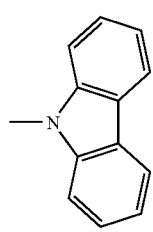 | 3 |
| 5 | 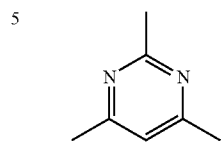 | 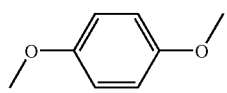 | 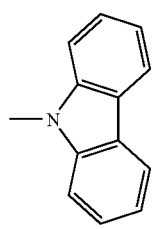 | 3 |
| 6 | 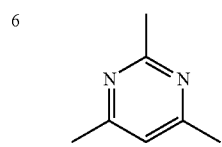 | 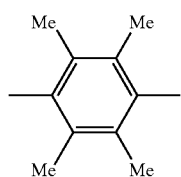 | 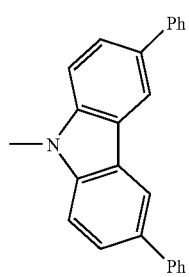 | 3 |
| 7 | 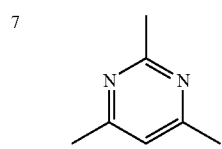 | 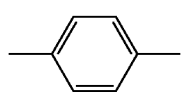 | 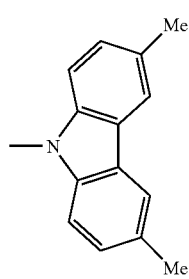 | 3 |

-continued
| | | | | |
|---|---|---|---|---|
| 8 | 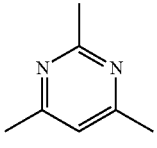 | 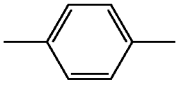 | 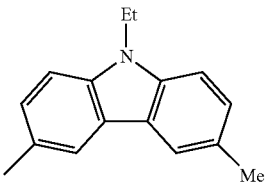 | 3 |
| 9 | 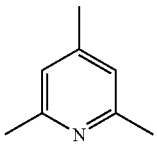 | — | 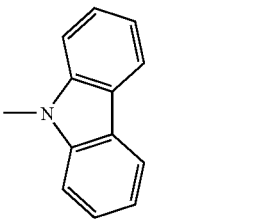 | 3 |
| 10 | 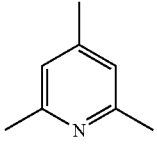 | 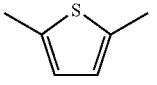 | 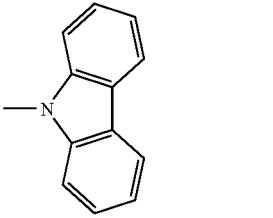 | 3 |
| 11 | 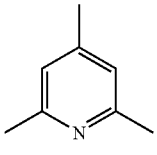 | 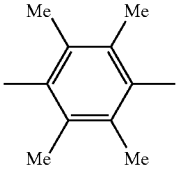 | 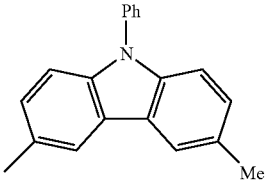 | 3 |
| 12 | 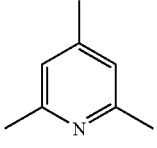 | 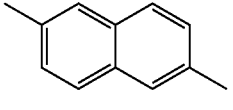 | 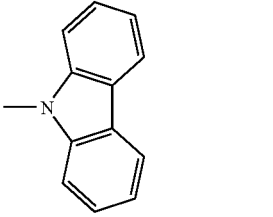 | 3 |
| 13 | 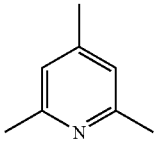 | 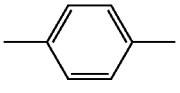 | 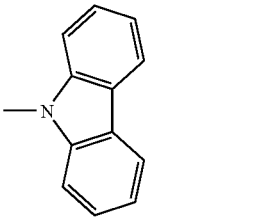 | 3 |
| 14 | 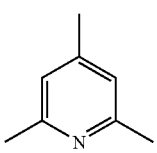 | 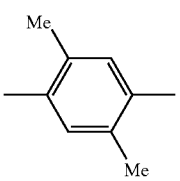 | 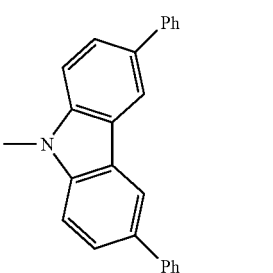 | 3 |

-continued
| 15 | 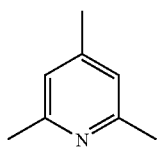 | 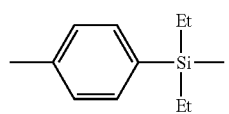 | 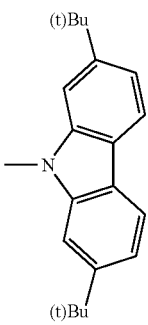 | 3 |
| 16 | 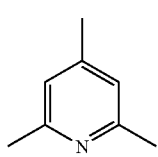 | 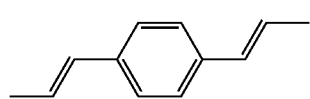 | 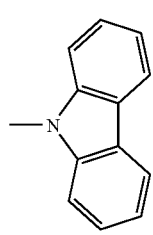 | 3 |
| 17 | 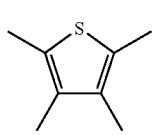 | 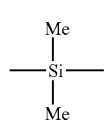 | 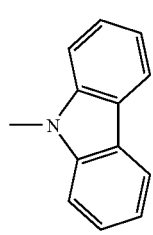 | 4 |
| 18 | 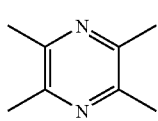 | 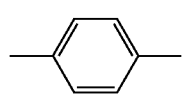 | 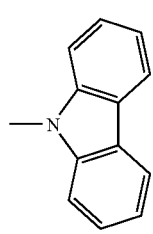 | 4 |
| 19 | 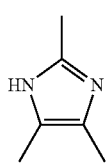 | 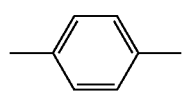 | 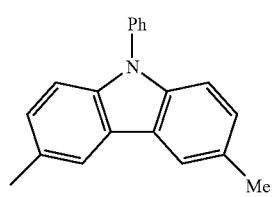 | 3 |
| 20 | 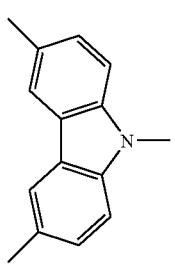 | 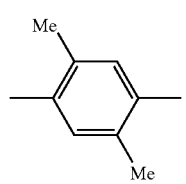 | 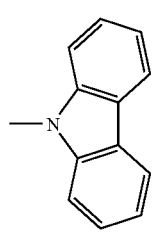 | 3 |

-continued
| | | | |
|---|---|---|---|
| 21 | 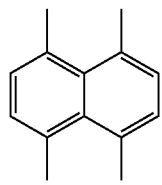 | 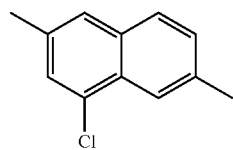 | 4 |
| 22 | 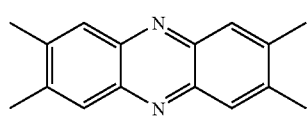 | 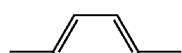 | 3 |
| 23 | 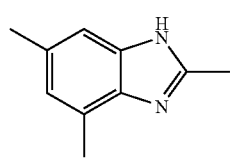 | 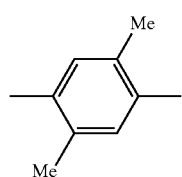 | 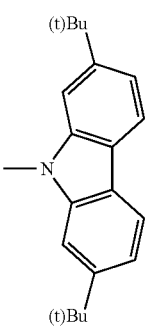 3 |
| 24 | 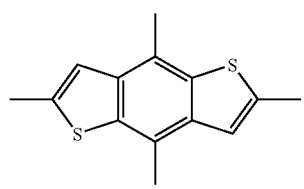 | 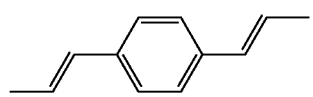 | 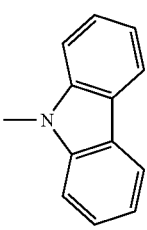 4 |
| 25 | 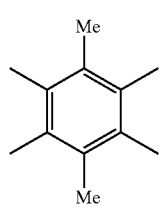 | 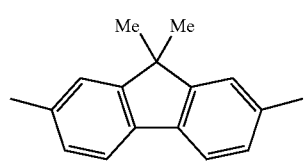 | 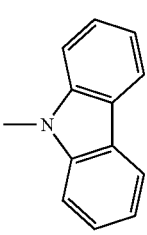 4 |

-continued
| | | | |
|---|---|---|---|
| 26 | 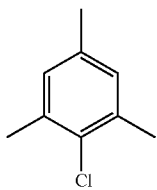 | 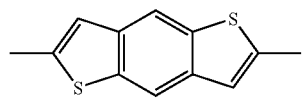 | 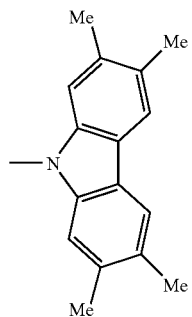 3 |
27 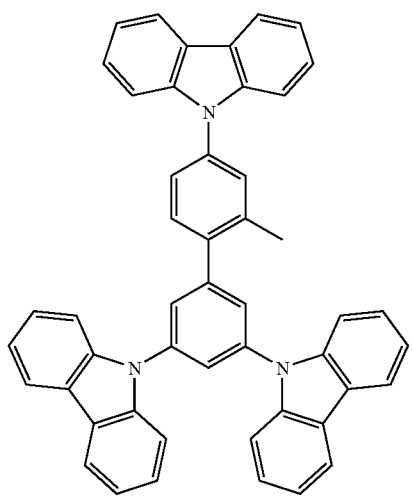
28 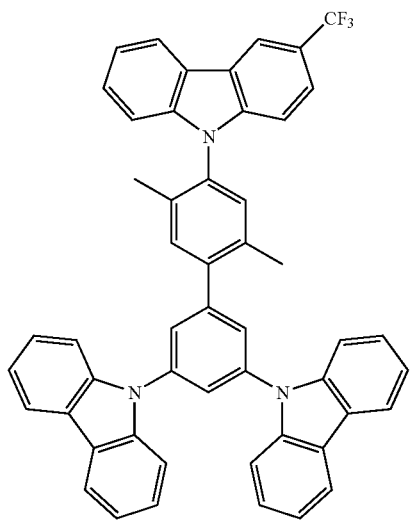

-continued
29 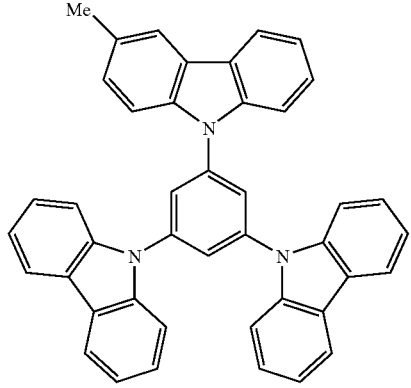
30 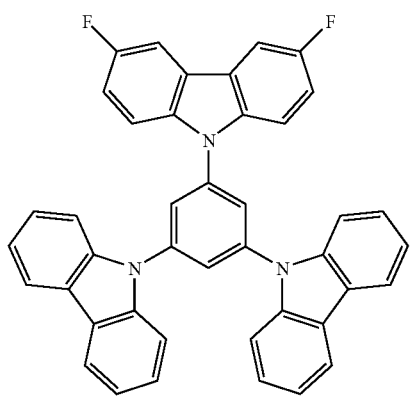
31 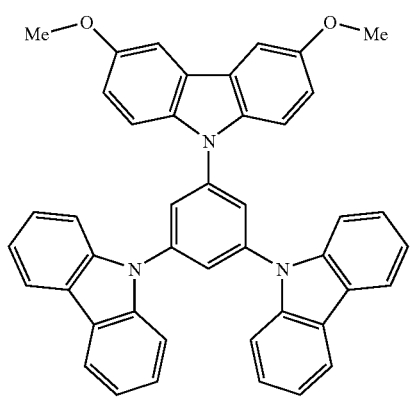
32 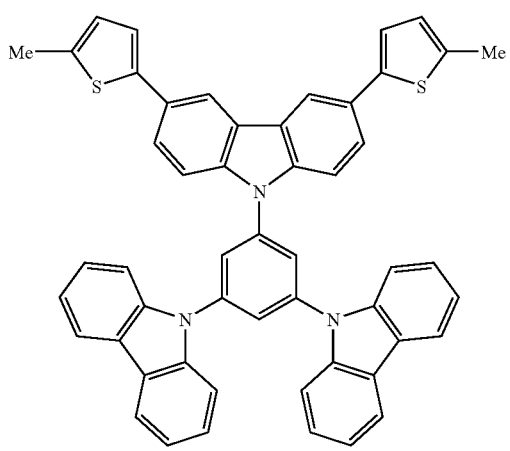

-continued
33
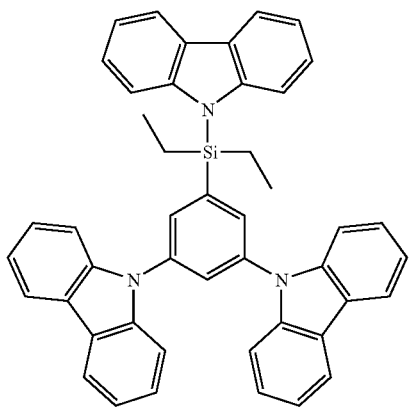
34
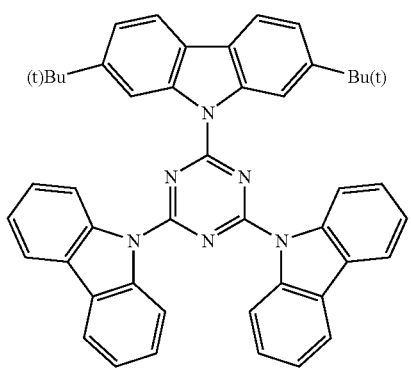
35
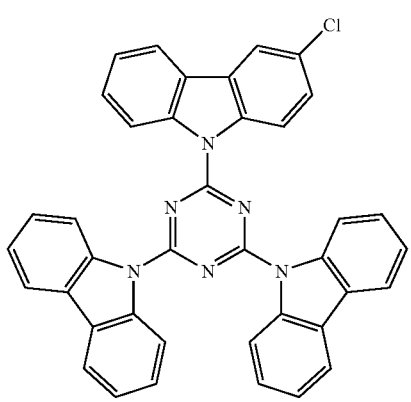
36
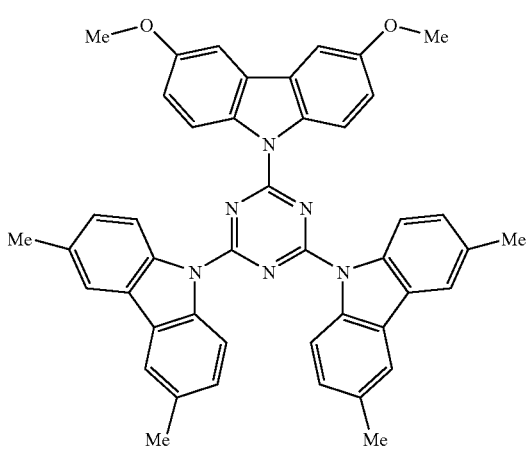

-continued
37
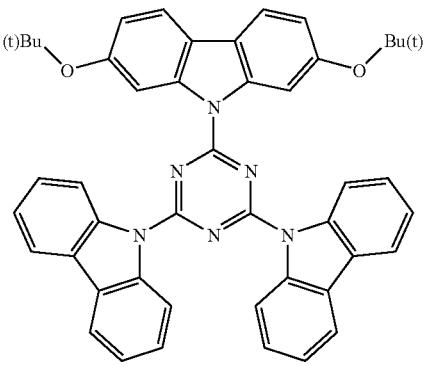
38
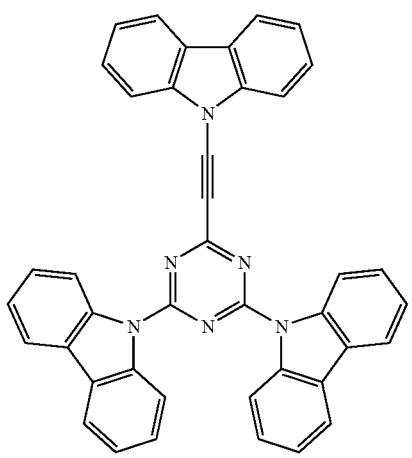
39
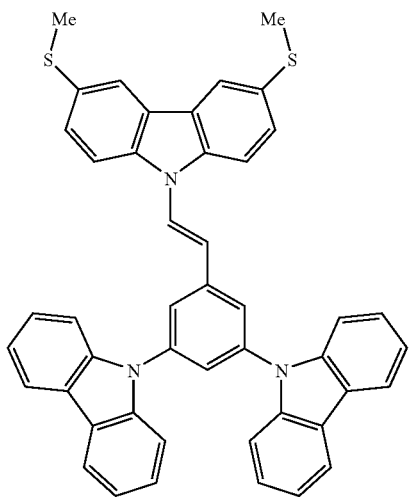

40
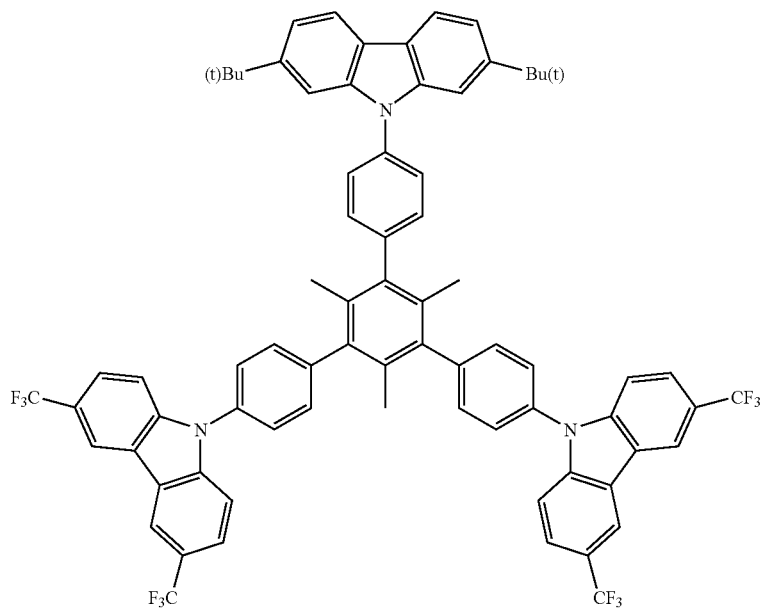
41
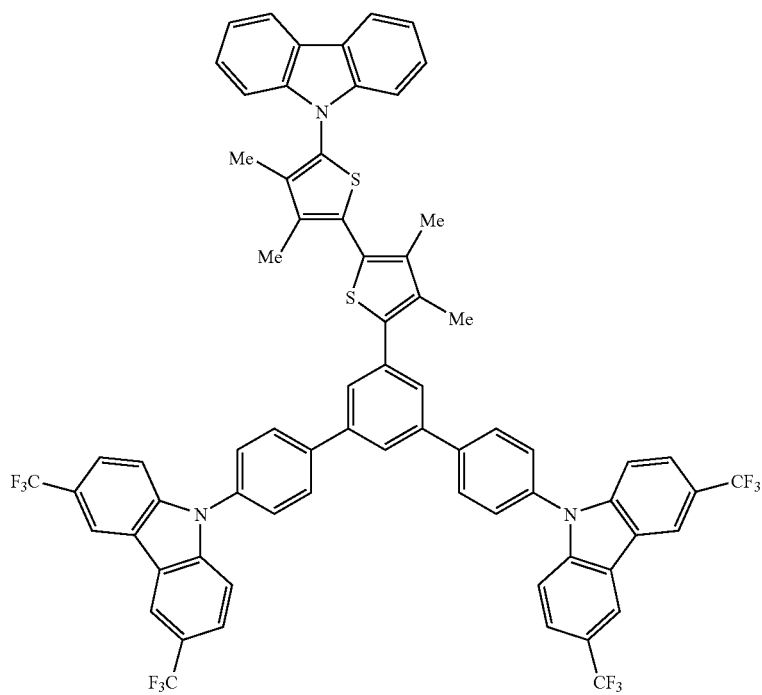

42
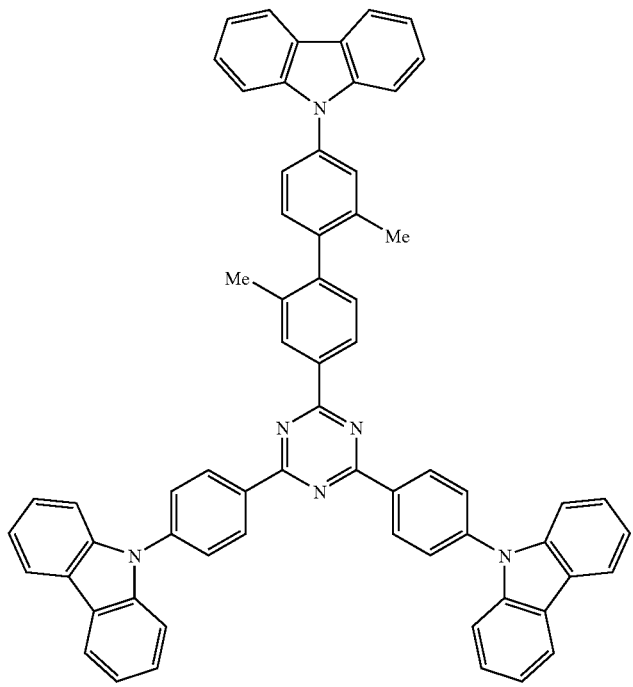
43
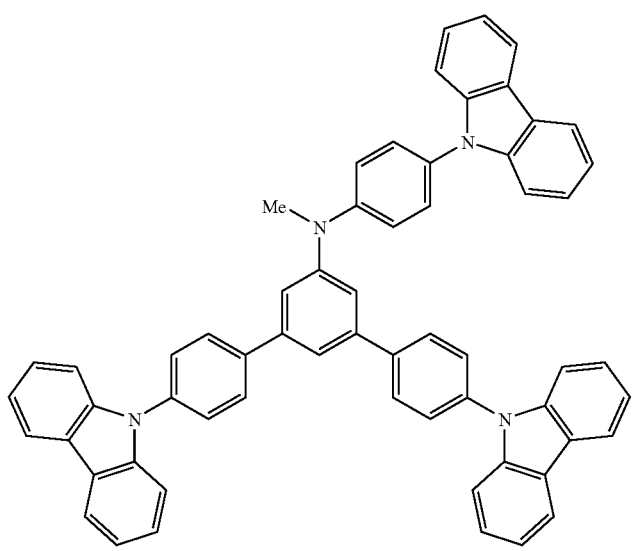

44
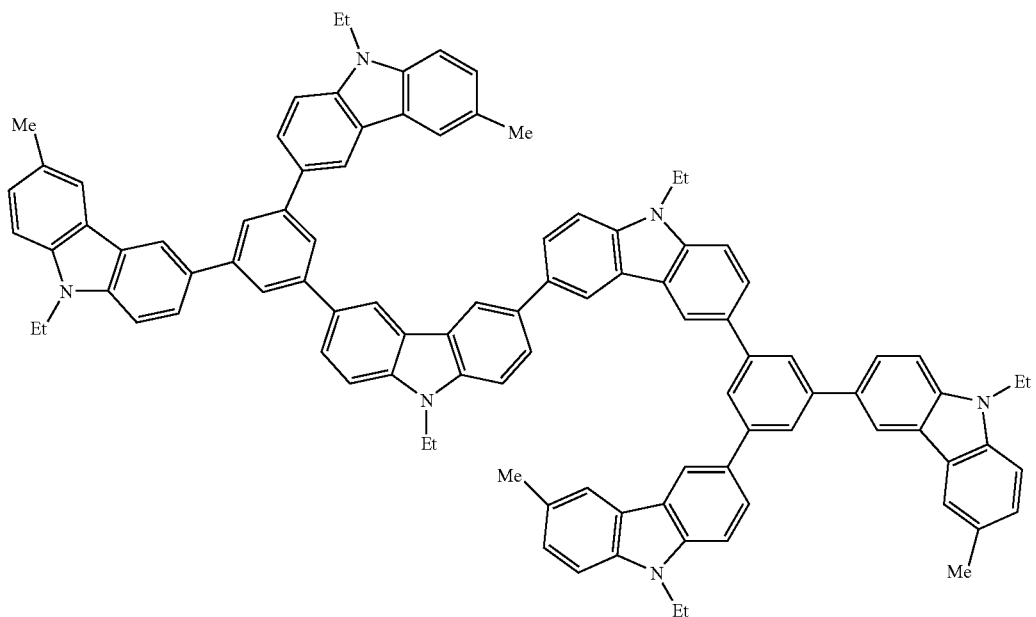
45
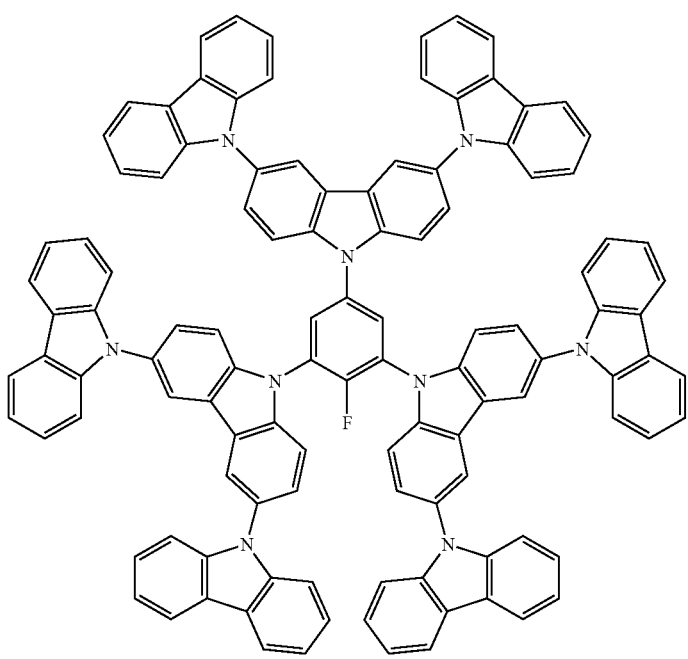

46

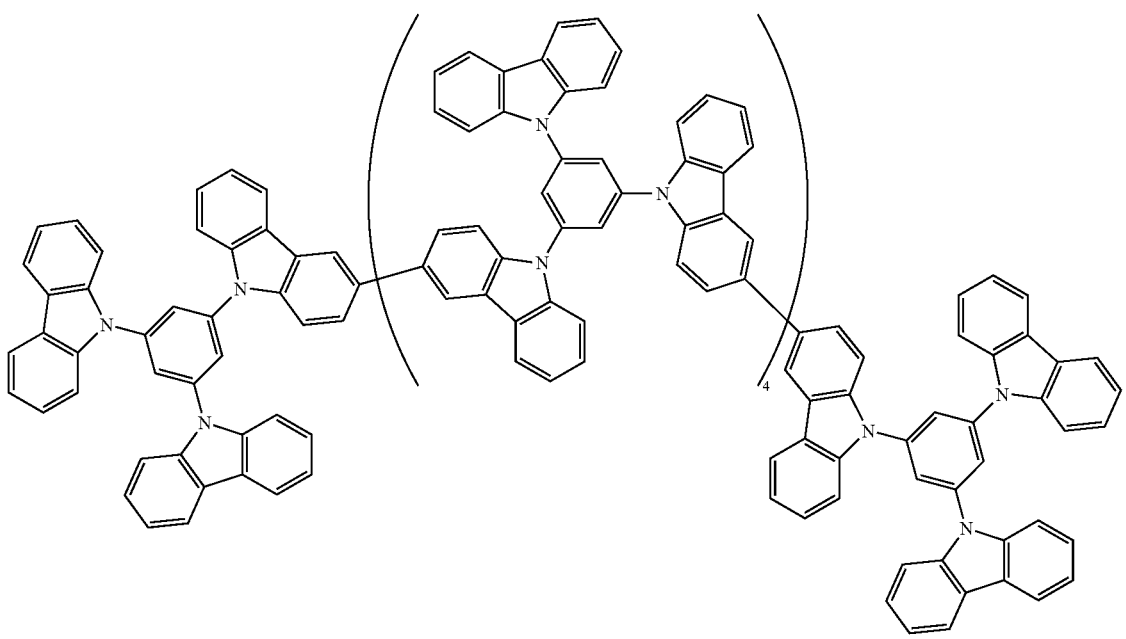

*Symbol "—" represents that L is a chemical bond.

The compound in the invention has a molecular weight of preferably from 600 to 2,000. The compound with a molecular weight of from 600 to 2,000 has a high Tg (glass transition temperature), and provides improved thermal stability and extends life of the organic EL element. The compound in the invention has a molecular weight of more preferably from 800 to 2,000.

The compound in the invention can be synthesized according to well-known methods in the art or a method disclosed in "Tetrahedron Lett.", 39 (1998), p. 2367-2370, Japanese Patent Publication No. 3161360, "Angew. Chem. Int. Ed.", 37 (1998), p. 2046-2067, "Tetrahedron Lett., 41 (2000), p. 481-484, "Synth. Commun.," 11 (7) (1981), p. 513-519, or "Chem. Rev.", 2002, 102, p. 1359-1469. Next, a typical synthetic process of some of the exemplified compounds will be shown.

Synthetic Example 1 (Synthesis of Exemplified Compound 1)

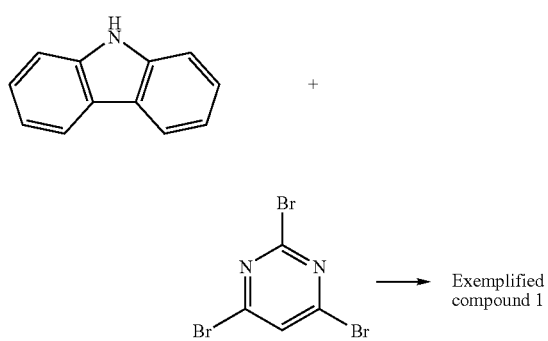

Synthetic Example 2 (Synthesis of Exemplified Compound 14)

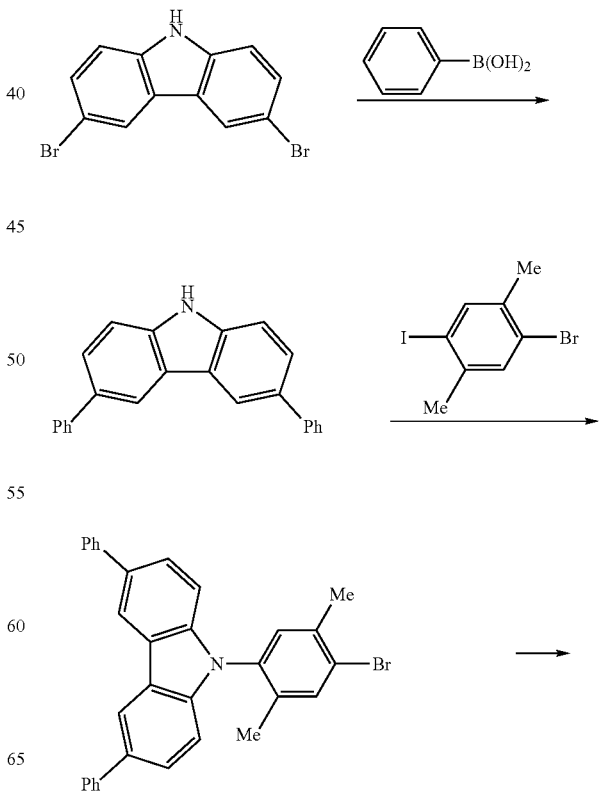

-continued

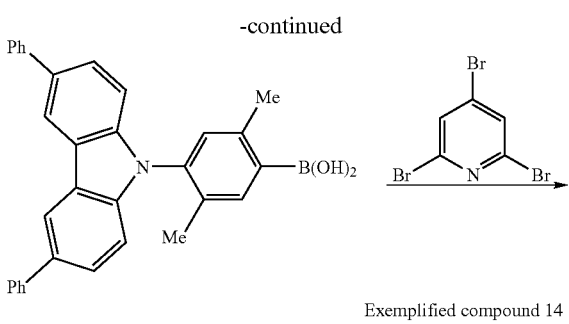

Exemplified compound 14

Synthetic Example 3 (Synthesis of Exemplified Compound 27)

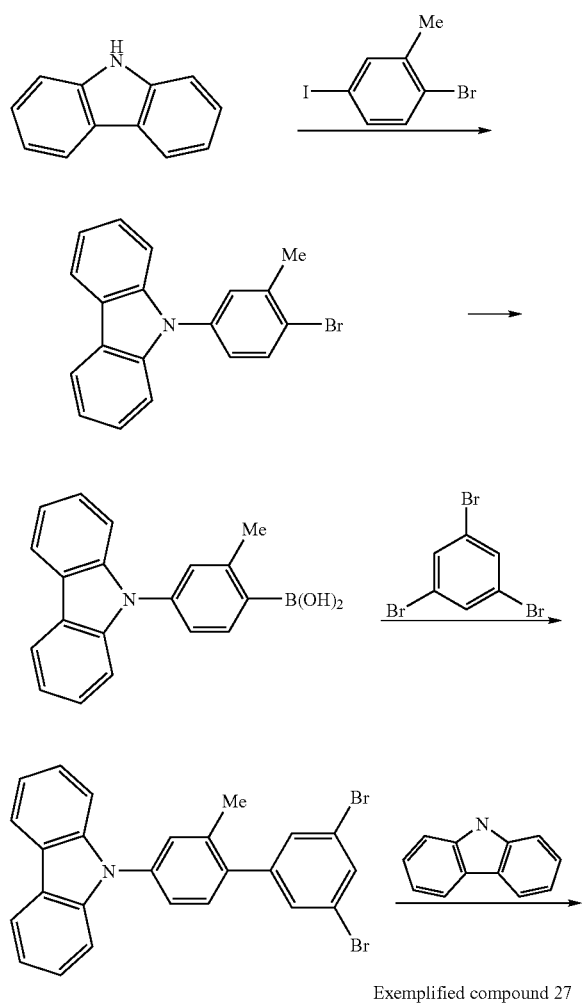

Exemplified compound 27

<<Component Layer of Organic EL Element>>

The constitution layer of the organic EL element will be explained below.
(i) Anode/Light emission layer/Electron transporting layer/Cathode
(ii) Anode/Hole transporting layer/Light emission layer/Electron transporting layer/Cathode
(iii) Anode/Hole transporting layer/Light emission layer/Hole blocking layer/Electron transporting layer/Cathode
(iv) Anode/Hole transporting layer/Light emission layer/Hole blocking layer/Electron transporting layer/Cathode buffering layer/Cathode
(v) Anode/Anode buffering layer/Hole transporting layer/Light emission layer/Hole blocking layer/Electron transporting layer/Cathode buffering layer/Cathode <<Anode>>

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO, and a material capable of forming an amorphous and transparent conductive layer such as IDIXO ($In_2O_3$—ZnO). The anode may be prepared by forming a thin layer of the electrode material according to a depositing or spattering method, and by forming the layer into a desired pattern according to a photolithographic method. When required precision of the pattern is not so high (not less than 100 μm), the pattern may be formed by depositing or spattering of the electrode material through a mask having a desired form. When light is emitted through the anode, the transmittance of the anode is preferably 10% or more, and the sheet resistance of the anode is preferably not more than several hundred Ω/□. The thickness of the layer is ordinarily within the range of from 10 nm to 1 μm, and preferably from 10 to 200 nm, although it may vary due to kinds of materials used.

<<Cathode>>

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable from the view point of the electron injecting ability and resistance to oxidation. The cathode can be prepared forming a thin layer of such an electrode material by a method such as a deposition or spattering method. The sheet resistance as the cathode is preferably not more than several hundred Ω/□, and the thickness of the layer is ordinarily from 10 nm to 1 μm, and preferably from 50 to 200 nm. It is preferable in increasing the light emission efficiency that either the anode or the cathode of the organic EL element is transparent or semi-transparent.

Further, a transparent or translucent cathode can be prepared by forming a layer of the transparent electroconductive material described in the anode above on a 1 to 20 μm thick cathode of the above-described metal. Application of this cathode can provide an organic EL element in which both cathode and anode are transparent.

Next, an injecting layer, a hole transporting layer, and an electron transporting layer used in a layer constitution of the organic EL element of the invention will be explained.

<<Injecting Layer>>: Electron Injecting Layer, Hole Injecting Layer>>

The injecting layer is optionally provided, for example, an electron injecting layer or a hole injecting layer, and may be provided between the anode and the light emission layer or hole transporting layer, and between the cathode and the light emission layer or electron transporting layer as described above.

The injecting layer herein referred to is a layer provided between the electrode and an organic layer in order to reduce the driving voltage or to improve of light emission efficiency. As the buffer layer there are a hole injecting layer (an anode buffer layer) and an electron injecting layer (a cathode buffer layer), which are described in "Electrode Material" page 123, Div. 2 Chapter 2 of "Organic EL element and its frontier of industrialization" (published by NTS Corporation, Nov. 30, 1998) in detail.

The anode buffer layer (hole injecting layer) is described in Japanese Patent O.P.I. Publication Nos. 9-45479, 9-260062, and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer (electron injecting layer) is described in Japanese Patent O.P.I. Publication Nos. 6-325871, 9-17574, and 10-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The buffer layer (injecting layer) is preferably very thin and has a thickness of preferably from 0.1 nm to 5 μm depending on kinds of the material used.

<<Blocking Layer>>: Hole Blocking Layer, Electron Blocking Layer>>

The blocking layer is a layer provided if necessary in addition to the fundamental configuration layers as described above, and is for example a hole blocking layer as described in Japanese Patent O.P.I. Publication Nos. 11-204258, and 11-204359, and on page 237 of "Organic EL element and its frontier of industrialization" (published by NTS Corporation, Nov. 30, 1998).

The hole blocking layer is an electron transporting layer in a broad sense, and is comprised of material having an ability of transporting electrons but an extremely poor ability of holes, which can increase a recombination probability of electrons and holes by transporting electrons and blocking holes.

On the other hand, the electron blocking layer is an hole transporting layer in a broad sense, and is comprised of material having an ability of transporting holes but an extremely poor ability of electrons, which can increase a recombination probability of electrons and holes by transporting holes and blocking electrons.

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

In the organic EL element of the invention, it is preferred that the excited triplet energy of all of a host contained in the light emission layer and materials contained in the hole transporting layer or electron transporting layer, each being adjacent to the light emission layer, be higher than that of the phosphorescent dopant. It is especially preferred that the 0-0 band wavelength (hereinafter also referred to as phosphorescence 0-0 band) of the phosphorescent spectra of the host contained in the light emission layer, and materials of the hole transporting layer and the electron transporting layer each being adjacent to the light emission layer be no longer than 450 nm.

Next, the phosphorescence 0-0 band in the invention will be explained. Firstly, a measuring method of phosphorescence spectra will be explained.

A compound to be measured is dissolved in a mixture solvent of ethanol and methanol (=4:1 by volume) which is deoxygenated, placed in a cell for phosphorescence measurement, and exposed to light excited at a liquid nitrogen temperature of 77 K. Spectra of emission light are measured 100 ms after the excited light exposure.

When a compound to be measured is insoluble in the above solvent mixture, any solvent capable of dissolving the compound can be used. (In the above-described measuring method, solvent effect upon phosphorescence spectra is substantially extremely small and does not cause problem.)

In the invention, the shortest wavelength which gives emission maximum in the phosphorescence spectra measured according to the method described above is defined as a phosphorescence 0-0 band.

<<Light Emission Layer>>

The light emission layer in the invention is a layer where electrons and holes, injected from electrodes, an electron transporting layer or a hole transporting layer, are recombined to emit light. The portions where light emits may be portions in the light emission layer or portions at the interface between the light emission layer and the layer adjacent thereto.

A material used in the light emission layer (hereinafter also referred to as light emission material) is preferably an organic compound or a complex which emits fluorescence or phosphorescence, and can be used selecting from known compounds used in the light emission layer of a conventional organic EL element. Such a material is mainly an organic compound, and compounds described in Macromol. Synth., 125, 17-25 can be used according to intended color tone.

The light emission material may have a hole transporting capability or an electron transporting capability as well as a light emission capability. Most of the hole transporting material and electron transporting material can be used as a light emission material. The light emission material may be a polymer such as p-polypheneylene vinylene or polyfluorene, or a polymer material in which the polymer such as p-polypheneylene vinylene or polyfluorene is incorporated in the main or side chain of the polymer material.

The light emission layer can be formed employing a known method such as a vacuum deposition method, a spin coat method, a casting method and an LB method. The thickness of the light emission layer is not specifically limited, but is ordinarily from 5 nm to 5 μm, and preferably 5 to 200 nm. The light emission layer may be composed of a single layer comprising one or two or more kinds of light emission materials, or of plural layers comprising the same composition or different composition. It is preferred in the invention that the light emission layer be composed of two or more kinds of materials, and one of the materials is the compound in the invention.

The light emission layer can be formed by the method such as that described in Japanese Patent O.P.I. Publication No. 57-51781, in which a light emission material is dissolved in a solvent together with a binder such as a resin, and the thus obtained solution is formed into a thin layer by a method such as a spin-coat method. Thickness of the emission layer thus formed is not specially restricted. Although the thickness of the layer thus formed is optionally selected, the thickness is ordinarily from 5 nm to 5 μm, and preferably from 5 to 200 nm.

<<Host compound>>

In the light emission layer comprised of a mixture of two or more kinds of compounds, the compound having the highest content (by weight) in the mixture is a host compound (also referred to as simply a host) and the compound other than the host compound is a dopant compound (also referred to as simply a dopant). For example, when a compound A to a compound B ratio (by weight) in the light emission layer is 10:90, the compound A is a dopant compound, and the compound B is a host compound.

Further, when the content ratio, compound A:compound B:compound C in the light emission layer is 5:10:85, compounds A and B are dopant compounds, and compound C is a host compound.

The host compound in the light emission layer is preferably an organic compound or a complex. It is preferred in the invention that the excited triplet energy of the host compound be higher than that of the dopant. It is especially preferred that the phosphorescence 0-0 band of the host compound be no longer than 450 nm, which enables a visible light emission, particularly a BGR light emission.

Providing the excited triplet energy of the host compound to be higher than that of the dopant enables dopant emission which comprises energy transfer from the host compound to the dopant. The host compound, in which the phosphorescence 0-0 band is no longer than 450 nm, has a wide energy gap (ionization potential-electron affinity, HOMO-LUMO), and advantageously works in the carrier trap type.

The host compound described above can be used selecting from known compounds used in the light emission layer of an organic EL element. Further, most of the hole transporting material or electron transporting material can be used as the host compound of the light emission layer.

The host compound may be a polymer such as polyvinyl carbazole or polyfluorene, or a polymer material in which the host compound as described above is incorporated in the main or side chain of the polymer material.

The host compound is preferably a compound with high Tg (glass transition temperature), which has a hole transporting capability and an electron transporting capability, and prevents the emission wavelength from shifting to longer wavelength.

<<Dopant>>

Next, the dopant compound will be explained.

The dopant is divided in two types in principle, one is an energy transfer type in which recombination of a carrier occurs on the host to which the carrier is transported to excite the host, the resulting energy is transferred to the dopant, and light is emitted from the dopant, and the other is a carrier trap type in which recombination of a carrier occurs on the dopant, a carrier trap material, and light is emitted from the dopant. However, in each type of the dopant, energy level of the dopant in excited state is lower than that of the host in excited state.

The phosphorescent compound in the invention is a compound which can emit light from the excited triplet, and has a phosphorescent quantum yield at 25° C. of not less than 0.001, preferably not less than 0.01, and more not less than 0.1. The phosphorescent compound in the invention is preferably used as a dopant.

The phosphorescent quantum yield can be measured according to a method described in the fourth edition "Jikken Kagaku Koza 7", Bunko II, page 398 (1992) published by Maruzen. The phosphorescent quantum yield can be measured in a solution employing various kinds of solvents. The dopant used in the invention is a compound, in which the phosphorescent quantum yield measured employing any one of the solvents falls within the above-described range.

The phosphorescent compound in the invention is preferably a metal complex containing a metal belonging to a group VIII of the periodic table as a center metal or a complex containing a rare earth element as a center element, more preferably an iridium compound (an iridium complex), an osmium compound (an osmium complex) or a platinum compound (a platinum complex), and still more preferably an iridium compound (an iridium complex).

Examples of the phosphorescent compound used in the invention will be listed below, but the invention is not limited thereto. These compounds can be synthesized according to a method described in Inorg. Chem., 40, 1704-1711.

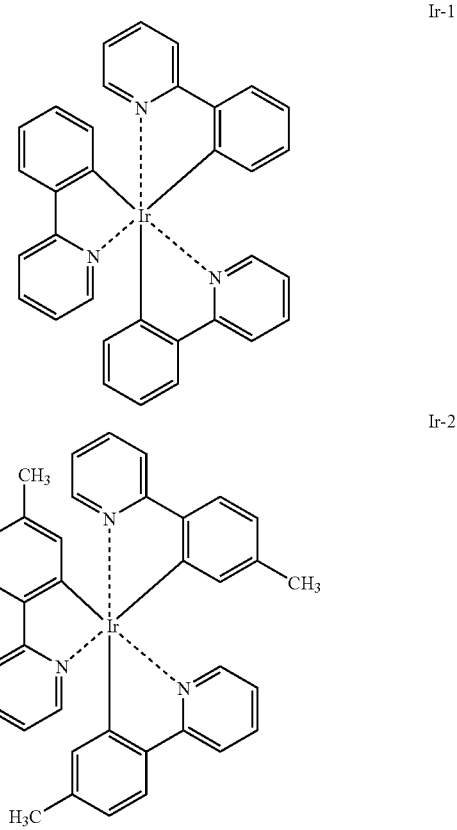

-continued
Ir-3
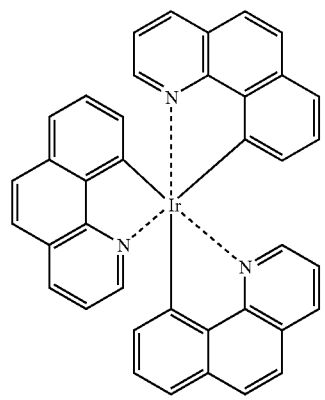
Ir-4
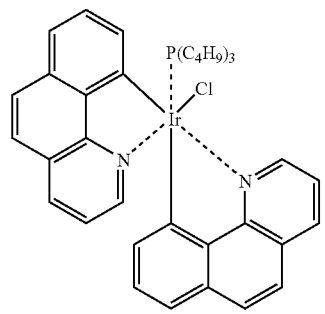
Ir-5
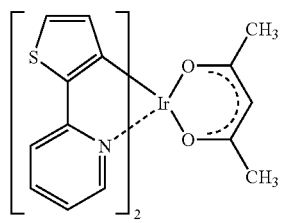
Ir-6
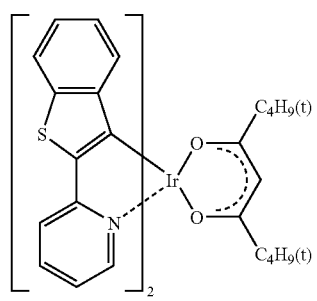
Ir-7
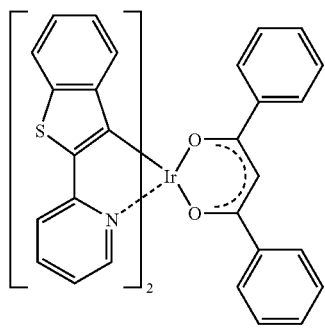
-continued
Ir-7
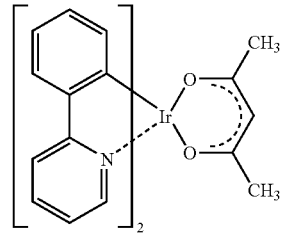
Ir-9
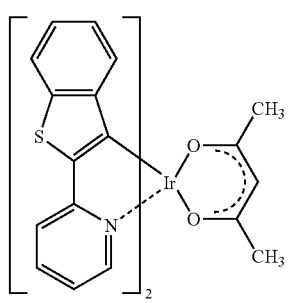
Ir-10
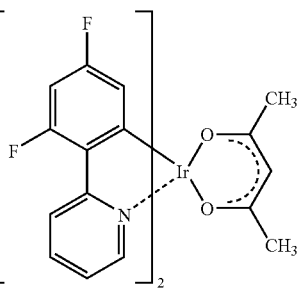
Ir-11
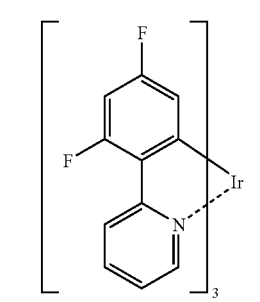
Ir-12
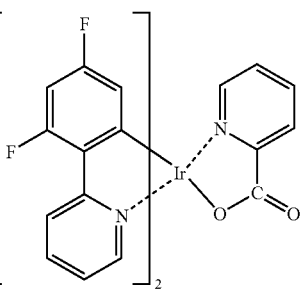

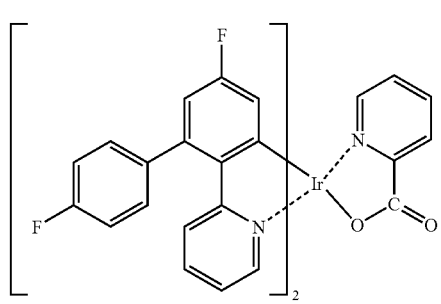

Ir-13

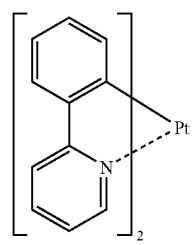

Pt-1

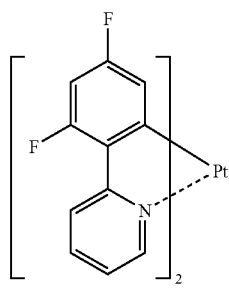

Pt-2

2,3,7,8,12,13,17,18-octaethyl-
21H,23H-porphine platinum (II)

Pt-3

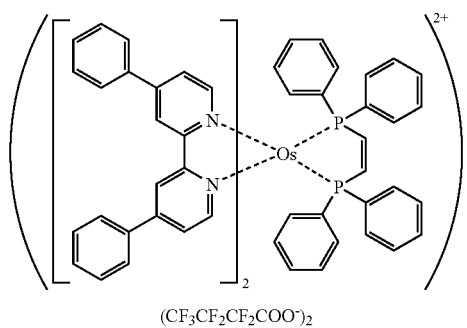

A-1

(CF$_3$CF$_2$CF$_2$COO$^-$)$_2$

The maximum phosphorescence wavelength of the phosphorescent compound is not specifically limited. Theoretically, the phosphorescence wavelength can be varied by selecting a center metal, a ligand, or a substituent of the ligand of metal complexes used. The plural host compounds or plural dopant compounds may be used. Usage of the plurality of the host compounds can adjust charge transfer, and obtain an organic EL element with high efficiency. Usage of the plurality of the dopant compounds can mix light with a different color, and can emit light with any color. A white light emission can be emitted by selecting kinds of the dopant or a doping amount of the dopant, which can be applied for an illuminating lamp or a back light.

As another embodiment of the invention, there is an organic electroluminescent element comprising, in addition to a fluorescent compound as a host compound and a phosphorescent compound, a fluorescent compound having a phosphorescent maximum wavelength in the wavelength region longer than the maximum wavelength of light emitted by the phosphorescent compound. In this case, the electroluminescence of the EL element is emitted from the fluorescent compound to which energy is transferred from the fluorescent compound and the phosphorescent compound. The fluorescent compound preferably has a high quantum yield in the form of solution. Herein, the quantum yield is preferably not less than 10%, and more preferably not less than 30%. Examples of the fluorescent compound include a qumarine dye, a cyanine dye, a chloconium dye, a squalenium dye, an oxobenzanthracene dye, a fluorescene dye, a rhodamine dye, a pyrylium dye, a perylene dye, a stilbene dye, and a polythiophene dye. The fluorescent quantum yield can be measured according to a method described in the fourth edition, Jikken Kagaku Koza 7, Bunko II, p. 362 (1992) (published by Maruzen).

In the invention, color of light to be emitted is expressed by a color obtained by applying measurements measured by means of a spectral radiation luminance meter CS-1000 (produced by Minilta Co., Ltd.) to a CIE chromaticity ordinate which is illustrated in FIGS. 4-16 on page 108 of "Shinpen Shikisai Kagaku Handbook" edited by Nippon Shikisai Gakkai, and published by Tokyo Daigaku Shuppankai.

The light emission layer can be formed by layering the dopant and host compound by a known method such as a vacuum deposition method, a spin coat method, a casting method, printing methods including an ink jet method, and an LB method. The thickness of the light emission layer is not specifically limited, but is ordinarily from 5 nm to 5 μm, and preferably from 5 nm to 200 nm.

<<Hole Transporting Layer>>

The hole transporting layer is comprised of material having an ability of transporting holes, and a hole injecting layer and an electron blocking layer are included in the hole transporting layer in a broad sense. The hole transporting layer or electron transporting layer may be a single layer or plural layers.

The hole transporting materials are not specifically limited, and can be optionally selected from those employed for hole transporting materials in conventional photoconductive elements or known materials used in the hole injecting layer or hole transporting layer of conventional EL elements.

The hole transporting material described above may be either an organic substance or an inorganic substance as long as it has a hole injecting ability, a hole transporting ability or an ability to form a barrier to electrons. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3- methylphenyl)-[1,1'-biphenyl]-4,4'-diamine (TPD), 2,2'-bis (4-di-p-tolylaminophenyl)propane, 1,1'-bis(4-di-p-tolylaminophenyl)cyclohexane, N,N,N',N'-tetra-p-tolyl-4,4'-diaminobiphenyl, 1,1'-bis(4-di-p-tolylaminophenyl)-4-phenylcyclohexane, bis(4-dimethylamino-2-methylphenyl)-phenylmethane, bis(4-di-p-tolylaminophenyl)-phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N, N-diphenylaminostylbenzene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used. As the hole injecting material or the hole transporting material, inorganic compounds such as p-Si and p-SiC are usable.

In the invention, it is preferred that the excited triplet energy of a hole transporting material contained in the hole transporting layer adjacent to the light emission layer be higher than that of the phosphorescent dopant. It is especially preferred that the phosphorescence 0-0 band of the hole transporting material of the hole transporting layer adjacent to the light emission layer be no longer than 450 nm. That is, the hole transporting material is preferably a material with high Tg, which has a hole transporting ability, and prevents deactivation of emission from the phosphorescent dopant.

The hole transporting layer can be formed by layering the hole transporting material by a known method such as a vacuum deposition method, a spin coat method, a casting method, printing methods including an ink jet method, and an LB method. The thickness of the hole transporting layer is not specifically limited, but is ordinarily from 5 nm to 5 μm, and preferably from 5 nm to 200 nm. The hole transporting layer may be composed of a single layer structure comprising one or two or more of the materials mentioned above.

<<Electron Transporting Layer>>

The electron transporting layer comprises a material (an electron transporting material) having an electron transporting ability, and in a broad sense refers to an electron injecting layer or a hole blocking layer. The electron transporting layer can be provided as a single layer or plural layers.

The electron transporting layer may be any layer, as long as it has a function of incorporating electrons injected from a cathode to a light emission layer, and a material used in the electron transporting layer can be optionally selected from known compounds used as electron transporting materials.

As an electron transporting material (which serves also as a hole blocking material) used in a single electron transporting layer or in the electron transporting layer closest to the cathode of plural electron transporting layers, compounds listed below are known.

Examples of the material used in the electron transporting layer (hereinafter also referred to as electron transporting material) include a nitro-substituted fluorene derivative, a diphenylquinone derivative, a thiopyran dioxide derivative, a carbodiimide, a fluolenylidenemethane derivative, an anthraquinodimethane, an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer chain or a polymer having the material as the polymer main chain can be also used.

A metal complex of an 8-quinolynol derivative such as aluminum tris(8-quinolynol) ($Alq_3$), aluminum tris(5,7-dichloro-8-quinolynol), aluminum tris(5,7-dibromo-8-quinolynol), aluminum tris(2-methyl-8-quinolynol), aluminum tris(5-methyl-8-quinolynol), or zinc bis(8-quinolynol) ($Znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for a light emission layer may preferably be employed as the electron transporting material. An inorganic semiconductor such as n-Si and n-SiC may also be used as the electron transporting material in a similar way as in the hole injecting layer or hole transporting layer.

In the invention, it is preferred that the excited triplet energy of an electron transporting material contained in the electron transporting layer adjacent to the light emission layer be higher than that of the phosphorescent dopant. It is especially preferred that phosphorescence 0-0 band of the electron transporting material of the electron transporting layer adjacent to the light emission layer be no longer than 450 nm.

The electron transporting layer can be formed by layering the hole transporting material by a known method such as a vacuum deposition method, a spin coat method, a casting method, printing methods including an ink jet method, and an LB method. The thickness of the electron transporting layer is not specifically limited, but is ordinarily from 5 nm to 5 μm, and preferably from 5 nm to 200 nm. The electron transporting layer may be composed of a single layer structure comprising one or two or more of the materials mentioned above.

<<Substrate (Referred to as Also Base Plate, Base or Support)>>

A substrate preferably employed for the organic electroluminescence element in the invention is not restricted to specific kinds of materials such as glass and plastic, as far as it is transparent. Examples of the substrate preferably used include glass, quartz and light transmissible plastic film. Especially preferred one is a resin film capable of providing flexibility to the organic EL element.

Examples of the resin film include films of polyethylene terephthalate (PET), polyethylene naphthalate (PEN), polyethersulfone (PES), polyetherimide, polyetheretherketone, polyphenylene sulfide, polyarylate, polyimide, polycarbonate (PC), cellulose triacetate (TAC), cellulose acetate propionate (CAP) and so on. The surface of the resin film may have a layer of an inorganic or organic compound or a hybrid layer of both compounds.

The external light emission efficiency of the organic electroluminescence element of the invention is preferably not less than 1%, and more preferably not less than 2% at room temperature. Herein, external quantum yield (%) is represented by the following formula:

External quantum yield (%)=(the number of photons emitted to the exterior of the organic electroluminescence element×100)/(the number of electrons-supplied to the organic electroluminescence element)

A hue improving filter such as a color filter may be used in combination. The multicolor light emission apparatus of the invention comprises at least two organic EL elements each having a different maximum emission wavelength. Next, preferable examples in the preparation of the organic EL element will be explained.

<<Preparation of Organic EL Element>>

For one example, the preparation of the organic EL element, which has the constitution, Anode/Hole injecting layer/Hole transporting layer/Light emission layer/Electron transporting layer/Electron injecting layer/Cathode, will be described. A thin layer of a desired material for an electrode such as a material of the anode is formed on a suitable substrate by a deposition or sputtering method to prepare the anode, so that the thickness of the layer is not more than 1 μm, and preferably within the range of from 10 to 200 nm. Then the hole injecting layer, the hole transporting layer, the light emission layer, the electron transporting layer and the electron injecting layer, which constitute the element, are formed on the resulting anode in that order as organic compound thin layers.

As methods for formation of the thin layers, there are a spin coating method, a casting method, an ink jet method, a vacuum deposition method, and a printing method, however, a spin coating method and a vacuum deposition method are preferably used, since a uniform layer can be formed and a pinhole is formed with difficulty. Different methods may be used for formation of different layers. When the vacuum deposition method is used for the thin layer formation method, although conditions of the vacuum deposition differs due to kinds of materials used, vacuum deposition is preferably carried out at a boat temperature of from 50° C. to 450° C., at a degree of vacuum of from $10^{-6}$ to $10^{-2}$ Pa, at a deposition speed of from 0.01 to 50 nm/second, and at a substrate temperature of from −50 to 300° C. to form a layer with a thickness of from 0.1 nm to 5 μm, and preferably from 5 to 200 nm.

After these layers has been formed, a thin layer comprised of a material for a cathode is formed thereon to prepare a cathode, employing, for example, a deposition method or sputtering method to give a thickness of not more than 1 μm, and preferably from 50 to 200 nm. Thus, a desired organic EL element is obtained. It is preferred that the layers from the hole injecting layer to the cathode are continuously formed under one time of vacuuming to obtain an organic EL element. However, on the way of the layer formation under vacuum a different layer formation method may be inserted. When the different method is used, its process is required to be carried out under a dry inert gas atmosphere.

In the multicolor display of the invention, the light emission layer only is formed using a shadow mask, and other layers than the light emission layer are common, and can be formed employing a vacuum method, a casting method, a spin coat method or a printing method in which patterning employing the shadow mask is not required.

When the light emission layer only is formed by patterning, the layer formation method, although not specifically limited, is carried out preferably according to a deposition method, an ink jet method or a printing method. When a deposition method is used as the layer formation method, patterning of the layer is preferably carried out employing a shadow mask.

Further, the organic EL element can be prepared in the reverse order, in which the cathode, the electron injecting layer, the electron transporting layer, the light emission layer, the hole transporting layer, the hole injecting layer, and the anode are formed in that order. When a direct current voltage, a voltage of 2 to 40 V is applied to the thus obtained multicolor display, setting the anode as a +polarity and the cathode as a −polarity, light emission occurs. When voltage is applied with the reverse polarity, no current flows, and light is not emitted at all. When an alternating voltage is applied, light emission occurs only at the time when the polarity of the anode is "+" and that of the cathode is "−". The wave shape of the alternating current may be any one.

The multicolor display of the invention can be used as a display device, a display, or various light emission sources. The display device or the display, which employs three kinds of organic EL elements, an element emitting a blue light, an element emitting a red light and an element emitting a green light, can present a full color image.

Examples of the display device or the display include a television, a personal computer, a mobile device or an AV device, a display for text broadcasting, and an information display used in a car. The multicolor emission apparatus may be used as particularly a display for reproducing a still image or a moving image. When the apparatus is used as a display for reproducing a moving image, the driving method may be either a simple matrix (passive matrix) method or an active matrix method.

Examples of the light emission sources include a home lamp, a room lamp in a car, a backlight for a watch or a liquid crystal, a light source for boarding advertisement, a signal device, a light source for a photo memory medium, a light source for an electrophotographic copier, a light source for an optical communication instrument, and a light source for an optical sensor, but are not limited thereto.

The organic EL element of the invention may be an organic EL element having a resonator structure.

The organic EL element having a resonator structure is applied to a light source for a photo-memory medium, a light source for an electrophotographic copier, a light source for an optical communication instrument, or a light source for a photo-sensor, but its application is not limited thereto. In the above application, a laser oscillation may be carried out.

<<Disply>>

The organic EL element of the invention can be used as a lamp such as an illuminating lamp or a light source for exposure, as a projection device for projecting an image, or as a display for directly viewing a still image or a moving image. When the element is used in a display for reproducing a moving image, the driving method may be either a simple matrix (passive matrix) method or an active matrix method. A display can be manufactured which presents a full color image, employing three or more kinds of organic EL elements each emitting light with a different color. Further, a display can be manufactured which presents a full color image, color-separating monochromatic light for example, a white light into three colors BGR through a color filter. Furthermore, a display can be manufactured which presents a full color image, converting a color light emitted from an organic electroluminescent element to another color light through a color converting filter, in which λmax of the light emitted from the organic electroluminescent element is not longer than 480 nm.

One example of the display comprising the organic EL element of the invention will be explained below employing Figures.

FIG. 1 is a schematic drawing of one example of a display comprising an organic EL element. FIG. 1 is a display such as that of a cellular phone, displaying image information due to light emission from the organic EL.

A display 1 comprises a display section A having plural pixels and a control section B carrying out image scanning in the display section A according to image information. The control section B is electrically connected to the display section A, transmits a scanning signal and a data signal to each of the plural pixels based on the image information transmitted from the exterior, and emits light from the pixels due to image scanning, whereby an image is displayed on the display section A.

Figure 2:
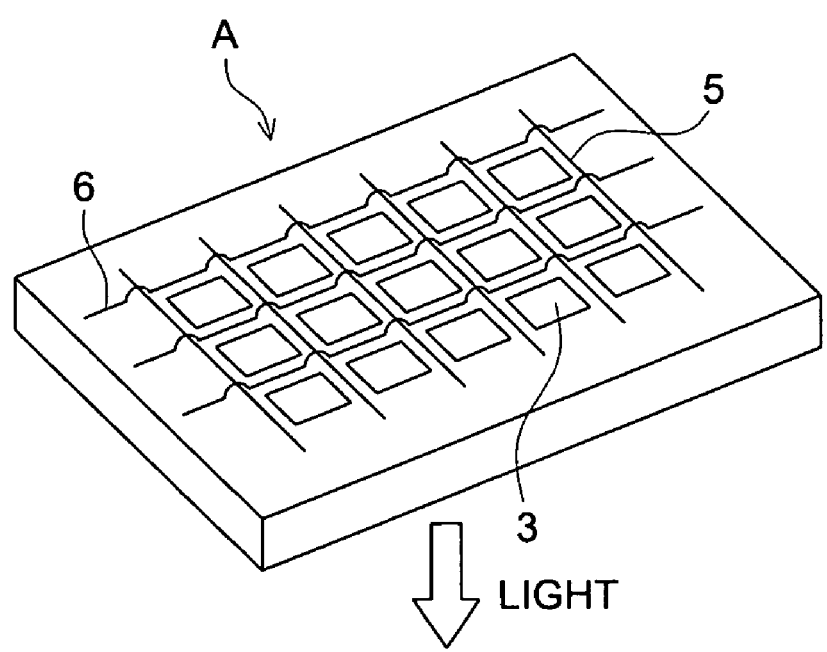
FIG. 2 is a schematic drawing of a display section A.

FIG. 2 is a schematic drawing of a display section A. The display section A comprises a glass substrate, plural pixels 3, and a wiring section comprising plural scanning lines 5 and plural data lines 6. The main members of the display section A will be explained below.

In FIG. 2, light from pixels 3 is emitted in the direction of an arrow. The plural scanning lines 5 and plural data lines 6 of the wiring section 2 each are composed of an electroconductive material, the lines 5 and the lines 6 being crossed with each other at a right angle, and connected with the pixels 3 at the crossed points (not illustrated). The plural pixels 3, when the scanning signal is applied from the scanning lines 5, receive the data signal from the data lines 6, and emit light corresponding to the image data received. Provision of red light emission pixels, green light emission pixels, and blue light emission pixels side by side on the same substrate can display a full color image.

Next, an emission process of pixels will be explained.

Figure 3:
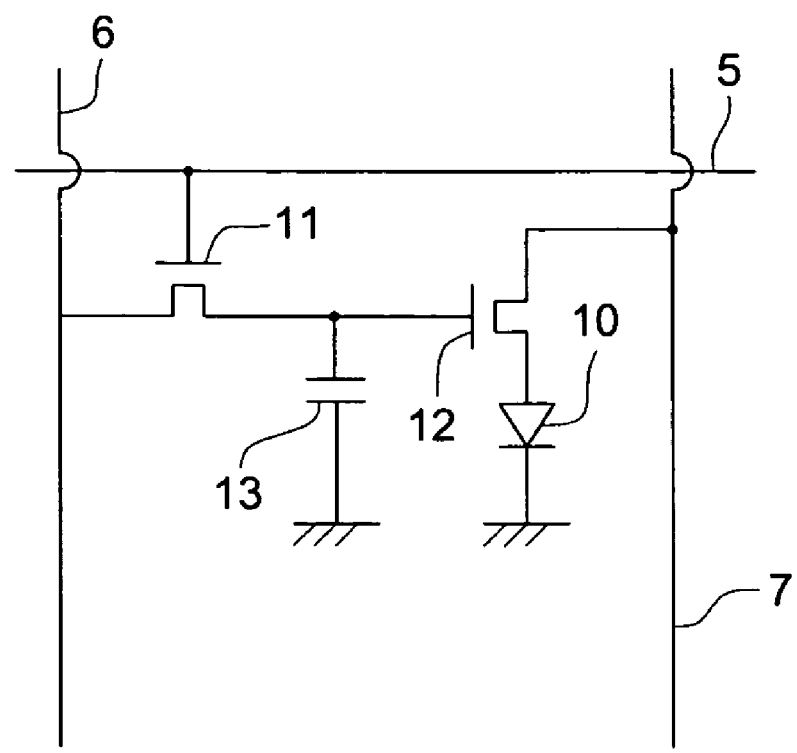
FIG. 3 is a schematic drawing of a pixel

FIG. 3 is a schematic drawing of a pixel. The pixel comprises an organic EL element 10, a switching transistor 11, a driving transistor 12, and a capacitor 13. When a pixel with a red light emission organic EL element, a pixel with a green light emission organic EL element, and a pixel with a blue light emission organic EL element are provided side by side on the same substrate, a full color image can be displayed.

In FIG. 3, an image data signal is applied through the data lines 6 from the control section B to a drain of the switching transistor 11, and when a scanning signal is applied to a gate of the switching transistor 11 through the scanning lines 5 from the control section B, the switching transistor 11 is switched on, and the image signal data applied to the drain is transmitted to the capacitor 13 and the gate of the driving transistor 12.

The capacitor 13 is charged according to the electric potential of the image data signal transmitted, and the driving transistor 12 is switched on. In the driving transistor 12, the drain is connected to an electric source line 7, and the source to an organic EL element 10. Current is supplied from the electric source line 7 to the organic EL element 10 according to the electric potential of the image data signal applied to the gate.

The scanning signal is transmitted to the next scanning line 5 according to the successive scanning of the control section B, the switching transistor 11 is switched off. Even if the switching transistor 11 is switched off, the driving transistor 12 is turned on since the capacitor 13 maintains a charged potential of image data signal, and light emission from the organic EL element 10 continues until the next scanning signal is applied. When the next scanning signal is applied according the successive scanning, the driving transistor 12 works according to an electric potential of the next image data signal synchronized with the scanning signal, and light is emitted from the organic EL element 10.

That is, light is emitted from the organic EL element 10 in each of the plural pixels 3 due to the switching transistor 11 as an active element and the driving transistor 12 each being provided in the organic EL element 10 of each of the plural pixels 3. This emission process is called an active matrix process.

Herein, light emission from the organic EL element 10 may be emission with plural gradations according to image signal data of multiple value having plural gradation potentials, and emission due to on-off according to a binary value of the image data signals.

The electric potential of the capacitor 13 may maintain till the next application of the scanning signal, or may be discharged immediately before the next scanning signal is applied. In the invention, light emission may be carried out employing a passive matrix method as well as the active matrix method as described above. The passive matrix method is one in which light is emitted from the organic EL element according to the data signal only when the scanning signals are scanned.

Figure 4:
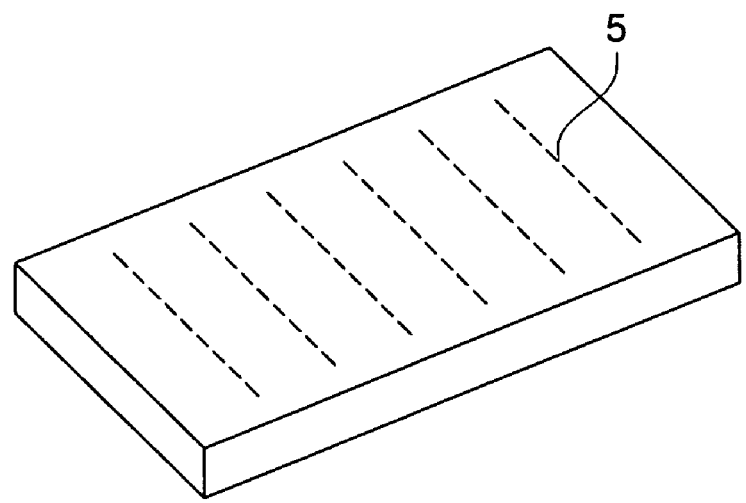
FIG. 4 is a schematic drawing of a display employing a passive matrix method.
Figure 4:
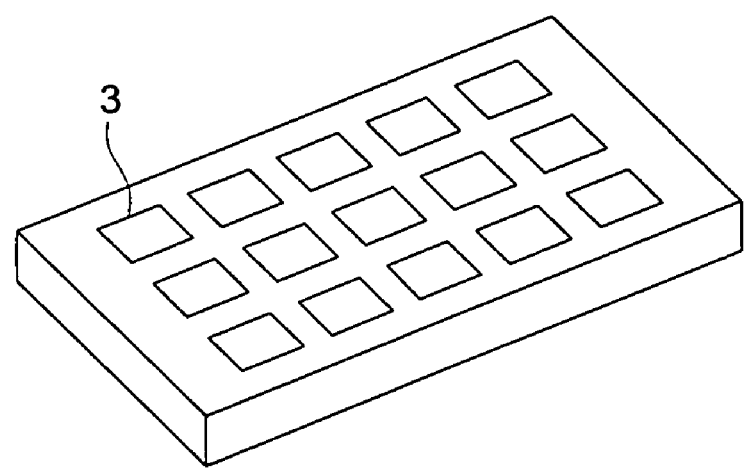
Figure 4:
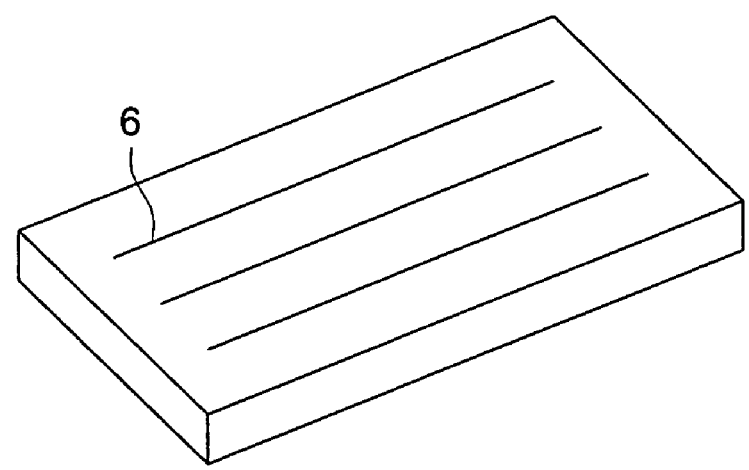

FIG. 4 is a schematic drawing of a display employing a passive matrix method.

In FIG. 4, pixels 3 are provided between the scanning lines 5 and the data lines 6, crossing with each other. When scanning signal is applied to scanning line 5 according to successive scanning, pixel 3 connecting the scanning line 5 emits according to the image data signal. The passive matrix method has no active element in the pixel 3, which reduces manufacturing cost of a display.

EXAMPLES

The present invention will be explained in the following examples, but is not limited thereto.

Example 1

<Preparation of Organic EL Element Sample>

An organic EL element sample was prepared as follows. A pattern was formed on a substrate (manufactured by NH Technoglass Co., Ltd.) composed of a glass plate (100 mm×100 mm×1.1 mm) and a 100 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes. The thus obtained transparent substrate was fixed on a substrate holder of a vacuum deposition apparatus available on the market. Further, 200 mg of α-NPD were put in a first resistive heating molybdenum boat, 200 mg of CBP were put in a second resistive heating molybdenum boat, 200 mg of bathocuproine (BCP) were put in a third resistive heating molybdenum boat, 100 mg of phosphorescent compound Ir(ppy)$_3$ were put in a fourth resistive heating molybdenum boat, and 200 mg of Alq$_3$ were put in a fifth resistive heating molybdenum boat.

The resulting boats were set in the vacuum deposition apparatus, and pressure in the vacuum tank was reduced to $4\times10^{-4}$ Pa. Then, the boat carrying α-NPD being heated by supplying an electric current to the boat, α-NPD was deposited onto the transparent substrate at a depositing speed of 0.1 nm/sec to form a hole transporting layer with a thickness of 25 nm. After that, the boat carrying CBP and the boat carrying phosphorescent compound Ir(ppy)$_3$ being heated by supplying an electric current to both boats, CBP at a depositing speed of 0.1 nm/sec and Ir(ppy)$_3$ at a depositing speed of 0.012 nm/sec were co-deposited onto the resulting hole transporting layer to form a light emission layer with a thickness of 35 nm. The temperature of the substrate at the time of the deposition was room temperature. Subsequently, the boat carrying BCP being heated by supplying an electric current to the boat, BCP was deposited onto the resulting light emission layer at a depositing speed of 0.1 nm/sec to form a first electron transporting layer with a thickness of 10 nm which could function as a hole blocking layer. Further, the boat carrying Alq$_3$ being heated by supplying an electric current to the boat, Alq$_3$ was deposited onto the resulting electron transporting layer at a depositing speed of 0.1 nm/sec to form a second electron transporting layer with a thickness of 40 nm. The temperature of the substrate at the time of the deposition was room temperature.

Subsequently, a lithium fluoride layer with a thickness of 0.5 nm and an aluminum layer with a thickness of 110 nm were deposited on the resulting electron transporting layer to form a cathode. Thus, organic EL element sample OLED 1-1 was prepared. Organic EL element sample OLED Nos. 1-2 through 1-18 were prepared in the same manner as the organic EL element sample OLED 1-1, except that CBP used in the light emission layer was replaced with compounds as shown in Table 1. The chemical structures of the compound used in the above are shown below.

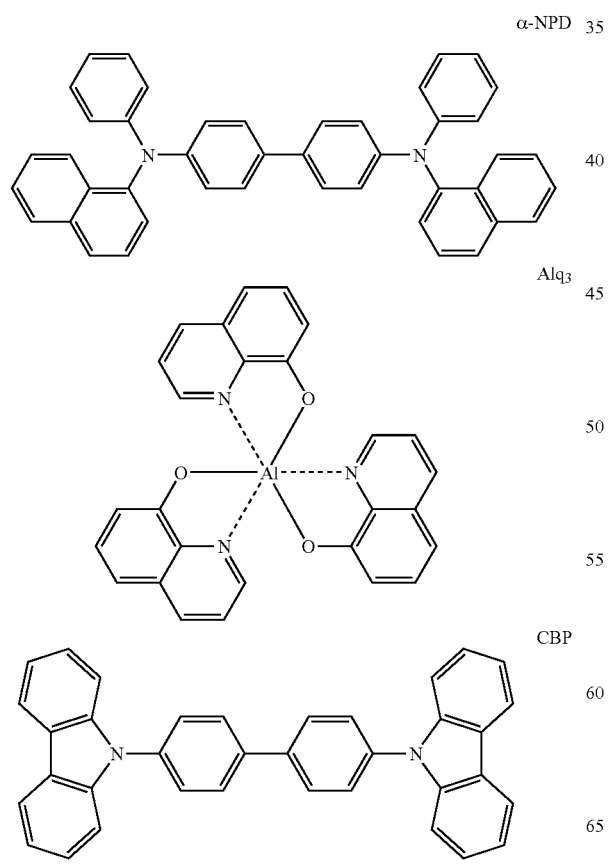

α-NPD

Alq$_3$

CBP

-continued

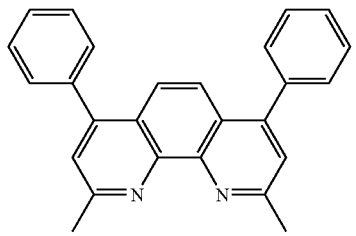

BCP

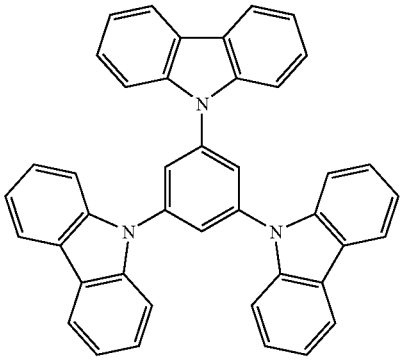

Ir(ppy)$_3$

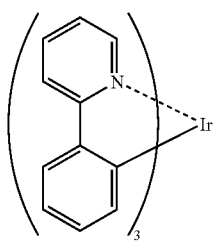

Comparative compound 1

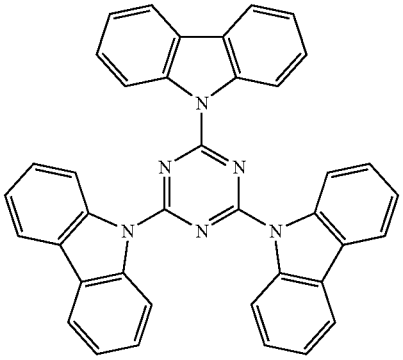

Comparative compound 2

<Evaluation of Organic EL Element Samples>

The resulting organic EL element samples were evaluated as follows, and the results are shown in Table 1.

(Emission Luminance, Emission Efficiency)

When an initial driving voltage of 3V was applied to organic EL element sample 1-1, an electric current began flowing and a green light was emitted from the phosphorescent compound as the dopant in the light emission layer. When a direct current voltage of 10V was applied to comparative organic EL element sample 1-1 at 23° C. in an atmosphere of a dry nitrogen gas, emission luminance (cd/m$^2$) and emission efficiency (1 m/W) of sample 1-1 were measured. Emission luminance and emission efficiency of the organic EL element samples 1-2 through 1-18 were measured, and expressed, respectively, by a relative value when the emission luminance and emission efficiency of the organic EL element sample 1-1 were set at 100, respectively. Emission luminance and emission efficiency above were measured according to CS-1000 produced by Minolta Co., Ltd.

(Durability)

When the sample was driven by supplying a constant electric current of 2.5 mA/cm², half life, i.e., time when the initial emission luminance was reduced by half was determined, and represented as a measure of durability. The half life of the organic EL element samples 1-2 through 1-18 was expressed by a relative value when the half life of the organic EL element sample 1-1 was set at 100. The results are shown in Table 1.

TABLE 1

| Sample OLED No. | Compound used in light emission layer | Emission luminance | Emission efficiency | Durability | Remarks |
|---|---|---|---|---|---|
| 1-1 | CBP | 100 | 100 | 100 | Comp. |
| 1-2 | 1 | 140 | 139 | 189 | Inv. |
| 1-3 | 3 | 172 | 183 | 203 | Inv. |
| 1-4 | 6 | 166 | 150 | 198 | Inv. |
| 1-5 | 8 | 180 | 175 | 164 | Inv. |
| 1-6 | 9 | 192 | 197 | 152 | Inv. |
| 1-7 | 11 | 185 | 192 | 180 | Inv. |
| 1-8 | 14 | 179 | 188 | 196 | Inv. |
| 1-9 | 15 | 139 | 140 | 206 | Inv. |
| 1-10 | 18 | 202 | 193 | 178 | Inv. |
| 1-11 | 20 | 185 | 190 | 192 | Inv. |
| 1-12 | 24 | 140 | 138 | 197 | Inv. |
| 1-13 | 28 | 175 | 175 | 188 | Inv. |
| 1-14 | 33 | 163 | 174 | 165 | Inv. |
| 1-15 | 37 | 182 | 179 | 212 | Inv. |
| 1-16 | 41 | 194 | 197 | 184 | Inv. |
| 1-17 | Comparative compound 1 | 142 | 128 | 86 | Comp. |
| 1-18 | Comparative compound 2 | 130 | 133 | 107 | Comp. |

Comp.: Comparative, Inv.: Inventive

As is apparent from Table 1, inventive organic EL element samples comprising the compound in the invention as a host compound provide excellent emission luminance, emission efficiency and durability, as compared with a comparative organic EL element sample comprising CBP as a host compound, and provide emission luminance and emission efficiency more excellent or identical to a comparative organic EL element sample employing Comparative compound 1 or 2. The inventive organic EL element samples comprising the compound in the invention as a host compound provide excellent emission luminance, emission efficiency and durability, and it has been proved that they are extremely useful for an organic EL element.

Example 2

An organic EL element sample OLED 2-1, emitting a blue light, was prepared in the same manner as in organic EL element sample OLED 1-1 of Example 1, except that FIr(pic) was used as the phosphorescent compound instead of Ir(ppy)₃. Subsequently, organic EL element sample OLED 2-2 through 2-9 were prepared in the same manner as organic EL element sample OLED 2-1, except that CBP was replaced with those as shown in Table 2. The resulting samples were evaluated for emission luminance and emission efficiency in the same manner as in Example 1. The results are shown in Table 2.

TABLE 2

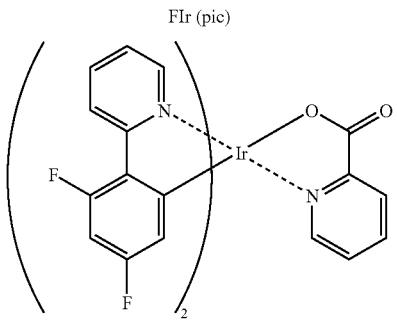

FIr(pic)

| Sample OLED No. | Compound used in light emission layer | Emission luminance | Emission efficiency | Remarks |
|---|---|---|---|---|
| 2-1 | CBP | 100 | 100 | Comparative |
| 2-2 | 1 | 136 | 140 | Invention |
| 2-3 | 3 | 179 | 176 | Invention |
| 2-4 | 8 | 171 | 169 | Invention |
| 2-5 | 15 | 185 | 183 | Invention |
| 2-6 | 20 | 183 | 177 | Invention |
| 2-7 | 37 | 186 | 192 | Invention |
| 2-8 | 41 | 182 | 173 | Invention |
| 2-9 | Comparative compound 1 | 127 | 138 | Comparative |

As is apparent from Table 2, inventive samples, employing the compound in the invention, provide greatly improved emission luminance and emission efficiency.

Example 3

An organic EL element sample OLED 3-1 was prepared in the same manner as in organic EL element sample OLED 1-1 of Example 1. Subsequently, organic EL element sample OLED 3-2 through 3-9, emitting a green light, were prepared in the same manner as organic EL element sample OLED 3-1, except that BCP used in the first electron transporting layer was replaced with those as shown in Table 3. The resulting samples were evaluated for emission luminance, emission efficiency and durability in the same manner as in Example 1. The results are shown in Table 3.

TABLE 3

| Sample OLED No. | Compound used in the first electron transporting layer | Emission luminance | Emission efficiency | Durability | Remarks |
|---|---|---|---|---|---|
| 3-1 | BCP | 100 | 100 | 100 | Comp. |
| 3-2 | 1 | 126 | 129 | 177 | Inv. |
| 3-3 | 3 | 136 | 138 | 219 | Inv. |
| 3-4 | 8 | 134 | 129 | 195 | Inv. |
| 3-5 | 15 | 127 | 122 | 237 | Inv. |
| 3-6 | 20 | 151 | 147 | 167 | Inv. |
| 3-7 | 37 | 145 | 148 | 211 | Inv. |
| 3-8 | 41 | 147 | 142 | 228 | Inv. |
| 3-9 | Comparative compound 1 | 115 | 112 | 91 | Comp. |

Comp.: Comparative, Inv.: Inventive

As is apparent from Table 3, inventive samples, in which the compound in the invention is used in the electron transporting layer, provide improved emission luminance, emission efficiency and durability. Particularly, the inventive samples are greatly improved in durability.

Example 4

An inventive organic EL element sample was prepared in the same manner as in the inventive sample of Example 1, except that Btp$_2$Ir(acac) was used as a phosphorescent compound instead of Ir(ppy)$_3$. Thus, inventive red light emission organic EL element sample was obtained. Next, the inventive green light emission organic EL element sample prepared in Example 1, the inventive blue light emission organic EL element sample prepared in Example 2, and the inventive red light emission organic EL element sample were suitably arranged side by side on the base plate (FIG. 2). Thus, a full color image display according to an active matrix system was obtained which had a structure as shown in FIG. 1.

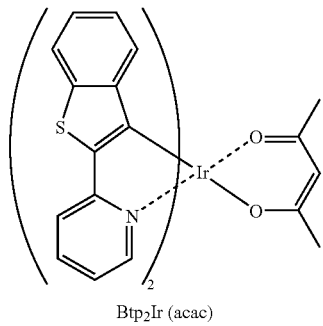

Btp$_2$Ir (acac)

FIG. 2 shows a schematic drawing of a displaying section A of a full color display prepared employing the multicolor display device obtained above. The displaying section A comprises a base plate 1, and provided thereon, plural pixels 3 (including red light emission pixels, green light emission pixels, and blue light emission pixels) and a wiring section including plural scanning lines 5 and plural data lines 6. The plural scanning lines 5 and plural data lines 6 each are composed of electroconductive material. The plural scanning lines 5 and plural data lines 6 were crossed with each other at a right angle, and connected with the pixels 3 at the crossed points (not illustrated in detail). Each of the plural pixels 3, which comprise an organic EL element corresponding to the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. A full color image can be displayed by a red light emission pixel, a green light emission pixel, and a blue light emission pixel, each suitably arranged on the base plate.

A full color clear moving image with high luminance and high durability was obtained by driving the full color display prepared above.

EFFECT OF THE INVENTION

The present invention can provide an organic EL element with high emission luminance, high quantum efficiency and long half life and a display employing the organic EL element, and provide particularly an organic EL element emitting a blue light with high emission luminance, high quantum efficiency and long half life and a display employing the organic EL element.

What is claimed is:

1. An organic electroluminescent element comprising a component layer including a light emission layer, wherein the light emission layer contains a phosphorescent compound, and the component layer contains a compound represented by the following formula 1, $$A\text{—}(Z)_n, \qquad \text{Formula 1}$$

wherein A represents a substituted aromatic ring residue having, as a substituent, a cycloalkyl group, an alkenyl group, an alkynyl group, an aryl group, a heterocyclic group, a halogen atom, an alkoxy group, a cycloalkoxy group, an aryloxy group, an alkylthio group, a cycloalkylthio group, an arylthio group, an alkoxycarbonyl group, an aryloxycarbonyl group, a sulfamoyl group, a ureido group, an acyl group, an acloxy group, and amido group, a carbamoyl group, a sulfinyl group, an alkylsulfonyl group, anarylsulfonyl group, an amino group, a nitro group, a cyano group, or a hydroxyl group; n is a natural number of from 3 to 5; and Z represents a monovalent organic group represented by the following formula 2, provided that formula 1 does not have an n-fold axis of symmetry, $$\text{—L—Cz}, \qquad \text{Formula 2}$$

wherein L represents a chemical bond or a divalent linkage group; and Cz represents a substituted or unsubstituted carbazole residue, and wherein in formula 1, at least one Z has a chemical structure different from that of another Z.

2. The organic electroluminescent element of claim 1, wherein the aromatic ring of the aromatic ring residue is a benzene ring, a pyridine ring, or a 1,3,5-triazine ring.

3. The organic electroluminescent element of claim 1, wherein in formula 2, L is a chemical bond or a group selected from the group consisting of arylene, heteroarylene, alkenylene and —Si(R)$_2$— in which R represents an alkyl group a cycloalkyl group, an alkenyl group, an alkynyl group, an aryl group, a heteroaryl group, a saturated heterocyclic group or a halogenated hydrocarbon group.

4. The organic electroluminescent element of claim 1, wherein L is a chemical bond.

5. The organic electroluminescent element of claim 1, wherein the phosphorescent compound is a complex containing a metal belonging to a group VIII of the periodic table as a center metal or a complex containing a rare earth element as a center element.

6. The organic electroluminescent element of claim 5, wherein the phosphorescent compound is an iridium complex, an osmium complex, or a platinum complex.

7. The organic electroluminescent element of claim 6, wherein the phosphorescent compound is an iridium complex.

8. The organic electroluminescent element of claim 1, wherein the light emission layer further contains the compound of formula 1.

9. The organic electroluminescent element of claim 1, wherein n in formula 1 is 3, provided that the formula 1 does not have a 3-fold axis of symmetry.

10. The organic electroluminescent element of claim 1, wherein the aromatic ring of the aromatic ring residue represented by A of formula 1 is an aromatic ring selected from the group consisting of a benzene ring, a pyridine ring, a pyridazine ring, a pyrimidine ring, a pyrazine ring, a 1,3,5-triazine ring, a 1,2,4-triazine ring, a pyrrole ring, an imidazole ring, a furan ring, a thiophene ring, and a condensed aromatic ring which two or more thereof are condensed to form.

11. A display comprising the organic electroluminescent element of any one of claims 1-10.

* * * * *